(12) United States Patent
Chung et al.

(10) Patent No.: US 12,324,095 B2
(45) Date of Patent: *Jun. 3, 2025

(54) AUXETIC STRETCHABLE SUBSTRATE WITH FLEXIBLE JOINT STRUCTURE AND METHOD OF MANUFACTURING SAME

(71) Applicant: KOREA INSTITUTE OF SCIENCE AND TECHNOLOGY, Seoul (KR)

(72) Inventors: Seungjun Chung, Seoul (KR); Jun Chan Choi, Seoul (KR); Jae Hong Sun, Seoul (KR); Heesuk Kim, Seoul (KR); Jeong Gon Son, Seoul (KR); Phillip Lee, Seoul (KR)

(73) Assignee: KOREA INSTITUTE OF SCIENCE AND TECHNOLOGY, Seoul (KR)

( * ) Notice: Subject to any disclaimer, the term of this patent is extended or adjusted under 35 U.S.C. 154(b) by 249 days.

This patent is subject to a terminal disclaimer.

(21) Appl. No.: 18/157,864

(22) Filed: Jan. 23, 2023

(65) Prior Publication Data
US 2024/0179838 A1 May 30, 2024

(30) Foreign Application Priority Data
Nov. 30, 2022 (KR) .................. 10-2022-0164409

(51) Int. Cl.
*B32B 3/12* (2006.01)
*B29D 28/00* (2006.01)
*H05K 1/02* (2006.01)
*H05K 1/03* (2006.01)

(52) U.S. Cl.
CPC .......... *H05K 1/0393* (2013.01); *B29D 28/00* (2013.01); *H05K 1/0283* (2013.01)

(58) Field of Classification Search
CPC .... B32B 3/12; B32B 3/16; B32B 3/26; B32B 3/266; H05K 1/0283; H05K 1/0393
See application file for complete search history.

(56) References Cited

U.S. PATENT DOCUMENTS

2009/0283891 A1  11/2009 Dekker et al.
2022/0162060 A1*  5/2022 Chung ................... B29C 35/02
(Continued)

FOREIGN PATENT DOCUMENTS

KR  10-2016-0020034 A  2/2016
KR  10-1749861 B1  6/2017
(Continued)

OTHER PUBLICATIONS

Office Action issued in KR 10-2022-0164409; mailed by the Korean Intellectual Property Office on Oct. 3, 2024.

*Primary Examiner* — Elizabeth E Mulvaney
(74) *Attorney, Agent, or Firm* — Studebaker Brackett PLLC

(57) ABSTRACT

Disclosed herein is a method of manufacturing an auxetic stretchable substrate with a flexible joint structure according to various embodiments of the present invention. The method includes preparing a substrate made of an elastic material, and forming an auxetic to form a plurality of first regions on the substrate, each of the plurality of first regions is a region in which a material constituting the auxetic is not printed, and at least some of the plurality of first regions have different lengths.

15 Claims, 18 Drawing Sheets

(56) References Cited

U.S. PATENT DOCUMENTS

| | | | | |
|---|---|---|---|---|
| 2023/0217587 A1* | 7/2023 | Lee | ..................... | H05K 1/0283 |
| | | | | 174/254 |
| 2023/0217588 A1* | 7/2023 | Lee | ..................... | H05K 1/0283 |
| | | | | 174/254 |
| 2024/0173901 A1* | 5/2024 | Chung | ................. | B29C 44/357 |

FOREIGN PATENT DOCUMENTS

| | | |
|---|---|---|
| KR | 102279067 B1 | 7/2021 |
| KR | 10-2022-0026957 A | 3/2022 |

\* cited by examiner

Multi-material beam with applied compression force.

Multi-material beam with applied beding force.

AUXETIC STRETCHABLE SUBSTRATE WITH FLEXIBLE JOINT STRUCTURE AND METHOD OF MANUFACTURING SAME

CROSS-REFERENCE TO RELATED APPLICATION

This application claims priority to and the benefit of Korean Patent Application No. 10-2022-0164409, filed on Nov. 30, 2022, the disclosure of which is incorporated herein by reference in its entirety.

BACKGROUND

1. Field of the Invention

The present invention relates to a stretchable substrate with a mechanical metamaterial having an auxetic structure, and more specifically, to a stretchable substrate of which a Poisson's ratio is controllable by allowing a uniform induced stress distribution for each position when a substrate is stretched, and a method of manufacturing the same.

2. Discussion of Related Art

Recently, research and development has been moving away from conductive devices in which electrodes are formed on a rigid substrate and becoming more active on stretchable electronic devices in which electrodes are formed on a flexible substrate. Stretchable electronic devices are electronic devices manufactured on a substrate which can be freely stretched against external stress and are next-generation electronic devices which maintain their electrical/physical characteristics even when mechanical deformation or an external force is applied. These stretchable electronic devices can be applied to flexible devices, wearable devices, and the like and furthermore, can be used for sensors or electrodes attached to a display or the human body.

The fields where stretchable electronic devices can be most widely used include stretchable displays, stretchable solar cells, and stretchable energy storage/power generation devices, and stretchable electronic devices show potential as a next-generation technology following flexible displays. In addition, due to their excellent mechanical variability, stretchable electronic devices not only increase a degree of design freedom but also secure mechanical stability against external forces. Thus, the market for stretchable electronic devices is on the rise to expand to the industries of wearable devices, electronic skins, smartphones, medical devices, healthcare monitoring systems, national defense, and aerospace.

As a specific example, the development of the display field is being directed from fixed flat/curved displays to an increase of a degree of deformation freedom in the form of flexible, foldable, and rollable displays which are folded or rolled in a single direction. Recently, as electronic devices have become smart and space mobility has become emphasized, there has arisen a need to develop a stretchable display which can be freely used and deformed in a multidimensional axial direction in various conditions, leaving fixed displays behind.

As described above, with the development of technology related to the stretchable display field, implementation of a new digital interface beyond the existing methods is expected to become possible. For example, a stretchable display can be implemented through an elastic substrate in which strain in relation to another axis can be controlled when it is stretched in one axial direction, that is, an elastic substrate having a negative Poisson's ratio.

However, in the stretchable display, negative Poisson's ratio control is possible in the overall aspect of the substrate, but stress may be non-uniform for each pixel section. Specifically, when stretched based on an external stress application point, a stretchable substrate using an auxetic structure may exhibit a different stress distribution for each position according to a shape of each unit structure body constituting the auxetic.

That is, since non-uniform induced stress is distributed for each position, deformation deviation may be different, which may cause non-uniform deformation of the structure body. For example, a phenomenon in which stress is concentrated in an intersection region of an auxetic structure body occurs, and thus structure shearing and delamination phenomena may frequently occur in the corresponding region.

Accordingly, in the art, there may be a demand for research and development of a stretchable substrate which has a negative Poisson's ratio and which can control a strain in a vertical direction of an in-plane relative to a stretching direction and, simultaneously, uniformize a stress distribution induced in a substrate to uniformly control a Poisson's ratio.

RELATED ART DOCUMENT

[Patent Document]
(Patent Document 1) Korean Registered Patent No. 10-1749861 (Jun. 15, 2017)

SUMMARY OF THE INVENTION

The present invention is directed to a stretchable substrate of which a Poisson's ratio can be uniformly controlled by allowing a uniform induced stress distribution for each position when a substrate is stretched, and a method of manufacturing the same.

The problems to be solved by the present invention are not limited to the above-described problem, and other problems that are not mentioned can be clearly understood by those skilled in the art from the following description.

According to an aspect of the present invention, there is provided a method of manufacturing an auxetic stretchable substrate with a flexible joint structure. The method may include preparing a substrate made of an elastic material, and forming an auxetic to form a plurality of first regions on the substrate, each of the plurality of first regions may be a region in which a material constituting the auxetic is not printed, and at least some of the plurality of first regions may have different lengths.

The auxetic may include a plurality of unit structure bodies, each having a re-entrant shape, and the first region may be formed in an intersection region where a plurality of sides forming each unit structure body intersect.

The method may further include forming a plurality of flexible joints in each of the plurality of first regions, and the plurality of flexible joints may be formed to be coupled to the auxetic through a printing process.

The plurality of flexible joints may each be formed of a material having an elastic modulus that is relatively lower than that of the auxetic.

The forming of the auxetic may include forming the auxetic through differential patterning for differentiating sizes of the first regions for each region.

Lengths of the plurality of flexible joints may become longer from an edge toward a central portion of the substrate.

Lengths of the plurality of flexible joints may become shorter as a deviation in Young's modulus between the flexible joint and the auxetic increases.

According to another aspect of the present invention, there is provided an auxetic stretchable substrate with a flexible joint structure. The auxetic stretchable substrate may include a substrate made of an elastic material, and an auxetic formed on the substrate and including a plurality of first regions, each of the plurality of first regions may be a region in which a material constituting the auxetic is not printed, and at least some of the plurality of first regions may have different lengths.

The auxetic may include a plurality of unit structure bodies, each having a re-entrant shape, and the first region may be formed in an intersection region where a plurality of sides forming each unit structure body intersect.

The auxetic stretchable substrate may further include a plurality of flexible joints provided in the plurality of first regions, and the plurality of flexible joints may be formed to be coupled to the auxetic through a printing process.

The plurality of flexible joints may each be formed of a material having an elastic modulus that is relatively lower than that of the auxetic.

The auxetic may be formed through differential patterning for differentiating sizes of the first regions for each region.

Lengths of the plurality of flexible joints may become longer from an edge toward a central portion of the substrate.

Lengths of the plurality of flexible joints may become shorter as a deviation in Young's modulus between the flexible joint and the auxetic increases.

According to still another aspect of the present invention, there is provided a flexible electronic device. The flexible electronic device may include a stretchable substrate, and a flexible electrode formed on the stretchable substrate, wherein the stretchable substrate may include a substrate made of an elastic material, and an auxetic formed on the substrate and including a plurality of first regions, and each of the plurality of first regions may be a region in which a material constituting the auxetic is not printed, and at least some of the plurality of first regions may have different lengths.

The details of other exemplary embodiments of the present invention are included in the detailed description and the accompanying drawings.

BRIEF DESCRIPTION OF THE DRAWINGS

Various aspects are now described with reference to the accompanying drawings, and similar reference numbers are used to collectively refer to similar components. In the following exemplary embodiments, for description purposes, numerous specific details are set forth in order to provide a thorough understanding of one or more aspects. However, it will be apparent that such aspect(s) can be practiced without these specific details, in which.

DETAILED DESCRIPTION OF EXEMPLARY EMBODIMENTS

Figure 1:
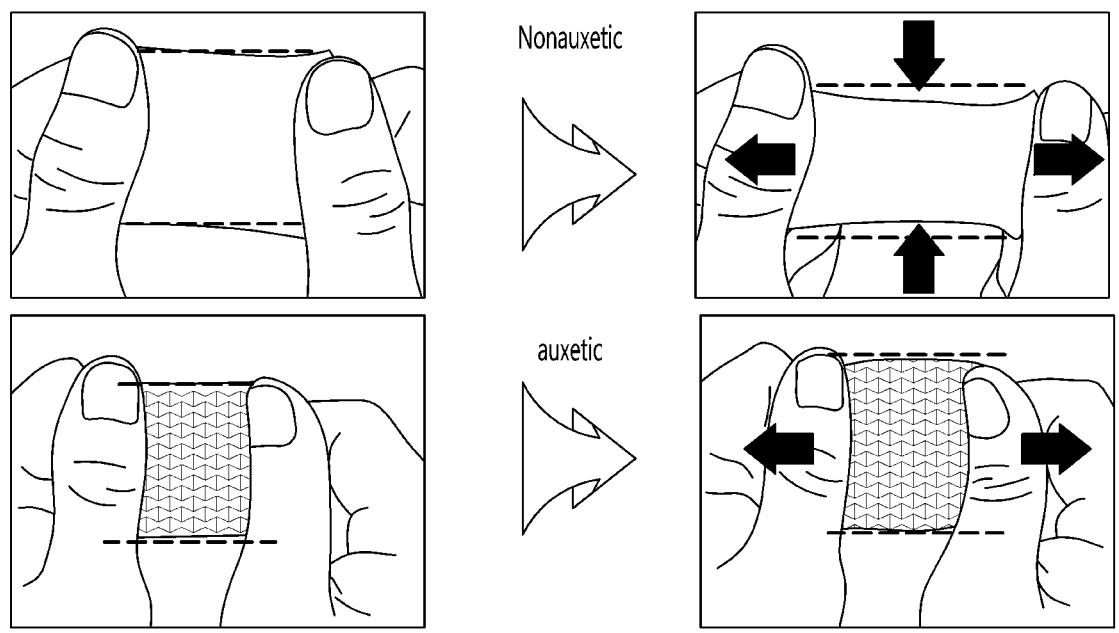
FIG. 1 is an exemplary diagram illustrating an auxetic structure and a non-auxetic structure according to one embodiment of the present invention.

Various exemplary embodiments and/or aspects are now disclosed with reference to the accompanying drawings. In the following description, for the purpose of description, numerous specific details are set forth in order to assist general understanding of one or more aspects. However, it can also be appreciated by those skilled in the art that such aspect(s) can be practiced without these specific details. The following description and the accompanying drawings describe in detail specific exemplary embodiments of one or more aspects. However, these aspects are illustrative and some of the various methods in principle of the various aspects can be used, and the described descriptions are intended to include all such aspects and their equivalents. Specifically, the terms "embodiment," "example," "aspect," and "exemplary example" used herein may not be construed as indicating that a described arbitrary aspect or design is superior to or advantageous over other aspects or designs.

Hereinafter, regardless of the reference numerals, the same or similar components are given the same reference numbers, and duplicate descriptions thereof will be omitted. In addition, in the following description of exemplary embodiments disclosed herein, when a detailed description of a known related art is determined to obscure the gist of the exemplary embodiments disclosed herein, the detailed description thereof will be omitted. In addition, the accompanying drawings are merely for easy understanding of the exemplary embodiments disclosed in the present specification, and the technical ideas disclosed in the present specification are not limited by the accompanying drawings.

Although terms first, second, and the like are used to describe various elements or components, these elements or components are substantially not limited by these terms. These terms are used only to distinguish one element or component from another element or component. Therefore, a first element or component described below may be substantially a second element or component within the technical spirit of the present invention.

Unless defined otherwise, all terms (including technical and scientific terms) used herein may be used in a sense commonly understood by those skilled in the art to which the present invention pertains. Further, terms which are defined in a commonly used dictionary are not ideally or excessively interpreted unless explicitly defined otherwise.

In addition, the term "or" is intended to mean an inclusive "or" rather than an exclusive "or." That is, unless otherwise specified or clear from the context, "X uses A or B" is intended to mean one of natural inclusive substitutions. That is, when X uses A, X uses B, or X uses both A and B, "X uses either A or B" can be applied to any of these cases. In addition, the term "and/or" used herein should be understood to refer to and include all possible combinations of one or more of listed related items.

In addition, the terms "comprise" and/or "have" mean that the feature and/or component is present, but it should be understood that the presence or addition of one or more other features, components, and/or a group thereof is not excluded. In addition, unless otherwise specified or when indicating a singular form is not clear from the context, the singular from in the present specification and the appended claims should generally be construed to mean "one or more."

When a component is referred to as being "connected" or "coupled" to another component, it may be directly connected or coupled to another component, but it should be understood that still another component may be present between the component and another component. Conversely, when a component is referred to as being "directly connected" or "directly coupled" to another component, it should be understood that still another component may not be present between the component and the other component.

As used herein, suffixes "module" and "part" for a component of the present invention are used or interchangeably used solely for ease of preparation of the present specification, and do not have different meanings and each of them does not function by itself.

When elements or layers are referred to as being "above" or "on" other element or layer, this includes all cases in which the elements or layers are directly on the other element or layer and another layer or element is interposed between the elements or layers. Conversely, when an element is referred to as being "directly on" or "directly above," this indicates that no other element or layer is intervening.

As shown in the drawings, spatially relative terms "below," "beneath," "lower," "above," "upper," and the like can be used to easily describe a correlation with respect to one element or another element. In addition to a direction shown in the drawings, the spatially relative terms should be understood as terms including different directions of components when the components are used or operated.

For example, when a component element shown in the drawing is inverted, the component described as being "below" or "beneath" another component may be disposed "above" another component. Consequently, the exemplary term "below" can include all of downward and upward directions. A component can be oriented in a different direction so that the spatially relative terms can be construed according to the orientation.

Objectives and effects of the present invention and technical configurations for achieving them will be made clear from embodiments described in detail below with reference to the accompanying drawings. In describing the present invention, when a detailed description of a known related function or configuration is determined to unnecessarily obscure the gist of the present invention, the detailed description thereof will be omitted. In addition, the terms described below are defined in consideration of the functions in the present invention, and these terms may be varied according to the intent or custom of a user or an operator.

However, the present invention is not limited to the exemplary embodiments described below and may be implemented in various other forms. The embodiments are provided such that this disclosure will be thorough and complete and will fully convey the scope of the present invention to those skilled in the art to which the present invention pertains, and the present invention is defined by only the scope of the appended claims. Therefore, the definitions of the terms used herein should follow contexts disclosed herein.

An auxetic stretchable substrate 100 with a flexible joint structure of the present invention has a negative Poisson's ratio and may include an auxetic 20 formed of a plurality of unit structure bodies. The auxetic 20 may be a mechanical metamaterial with a mechanism for exhibiting a new mechanical function that was not present before through the plurality of unit structure bodies. For example, the auxetic 20 in conjunction with a mechanical metamaterial may have a structure of expanding in a vertical direction opposite to a direction of typical stretching in nature.

More specifically, the auxetic 20 included in the auxetic stretchable substrate 100 may include the plurality of unit structure bodies. In this case, since each unit structure body is provided in the form of a specific shape, the auxetic 20 may have a negative Poisson's ratio. Poisson's ratio may be a ratio between strain in a transverse direction and strain in a longitudinal direction when a tensile force is applied to a material in a specific direction, and thus the material is stretched. In other words, the Poisson's ratio may be strain between the transverse direction and the longitudinal direction.

When a tensile force is applied to a minor axis, since signs of strain in a tensile direction and a lateral direction of a material are different, most materials have positive Poisson's ratios. However, when a material is designed to form a specific lattice structure, even when a constituent material has a positive Poisson's ratio, a negative Poisson's ratio can be implemented macroscopically.

As a specific example, referring to FIG. 1, when a stress is applied in the transverse direction, a material having a general non-auxetic structure is stretched in the transverse direction and simultaneously contracted in the longitudinal direction. That is, a Poisson's ratio between deformation in the longitudinal direction and deformation in the transverse direction due to a normal stress generated inside the material may have a positive number.

On the other hand, when a stress is applied in the transverse direction, a material having an auxetic structure may be stretched in both the transverse and longitudinal directions. That is, the Poisson's ratio due to normal stress generated inside the material may have a negative number.

According to one embodiment of the present invention, the auxetic stretchable substrate 100 may include a substrate 10 in which the auxetic 20 is formed. The substrate 10 included in the auxetic stretchable substrate 100 is provided to support a corresponding auxetic 20 in the process of forming the auxetic 20 and may be provided in the form of a film having a thin thickness. In addition, the substrate 10 may be formed of an elastic material having elasticity. For example, the substrate 10 may be formed of an elastic material having an elastic modulus that is greater than or equal to a predetermined reference value, such as polydimethylsiloxane (PDMS), thermoplastic polyurethane (TPU), VHB, butyl rubber, or the like. The detailed description of the above-described substrate is merely an example, and the present invention is not limited thereto.

The auxetic 20 may be provided on one surface of the substrate 10. In the present invention, the provision of the auxetic 20 on one surface of the substrate 10 may include providing the auxetic 20 on one surface of the substrate 10 in a fixing manner after manufacturing each of the substrate 10 and the auxetic 20, or forming the auxetic 20 on one surface of the substrate 10 in a process of forming the substrate 10. For example, a printing process is performed on an upper portion of the substrate 10 using an elastic material in a liquid state and curing is performed in a specific curing condition so that the auxetic 20 may be provided on the substrate 10. That is, the auxetic 20 may be provided by forming a plurality of unit structure bodies, each having a specific shape, through the printing process using an elastic material on the upper surface using the substrate 10 as a support. The detailed description of the above-described auxetic preparation process is merely an example, and the present invention is not limited thereto.

The printing process in the present invention is a process of printing a designed circuit pattern on a target object through an inkjet printer or laminator and may be a roll-to-roll process of forming (or stacking) a specific lattice structure (i.e., a plurality of unit structure bodies having specific shapes) through a stretchable or elastic material. The printing process may be a process using, for example, an inkjet device, a pneumatic dispenser, a screw dispenser, a screen printing device, a bar coater, or a stray printing device. The detailed descriptions of the devices used in the above-described printing process are merely examples, and the present invention is not limited thereto.

That is, the auxetic 20 may be provided on the substrate 10 through the printing process using an elastic material. Through the printing process, it is possible to form an auxetic corresponding to an interval and a size ranging from tens to hundreds of microns. This can provide a high degree of design freedom and a high degree of material freedom, and simultaneously, high efficiency in a large-area process.

As described above, unlike general materials, the auxetic 20 of the present invention may be a material designed to have a negative Poisson's ratio, that is, the same sign of strain in the transverse direction and the longitudinal direction. In other words, the auxetic stretchable substrate 100 of the present invention is formed of the auxetic 20 that is a mechanical metamaterial designed in a specific lattice structure. Thus, in the auxetic stretchable substrate 100, a negative Poisson's ratio or strain in a direction perpendicular to a stretching direction may be controlled. This Poisson's ratio is an inherent material characteristic but can be controlled by forming a specific structure in a material.

According to the embodiment, the auxetic of the present invention may relate to a re-entrant structure. As shown in FIGS. 1 to 5, the auxetic may be formed of a plurality of unit structure bodies, each having a re-entrant shape.

Figure 2:
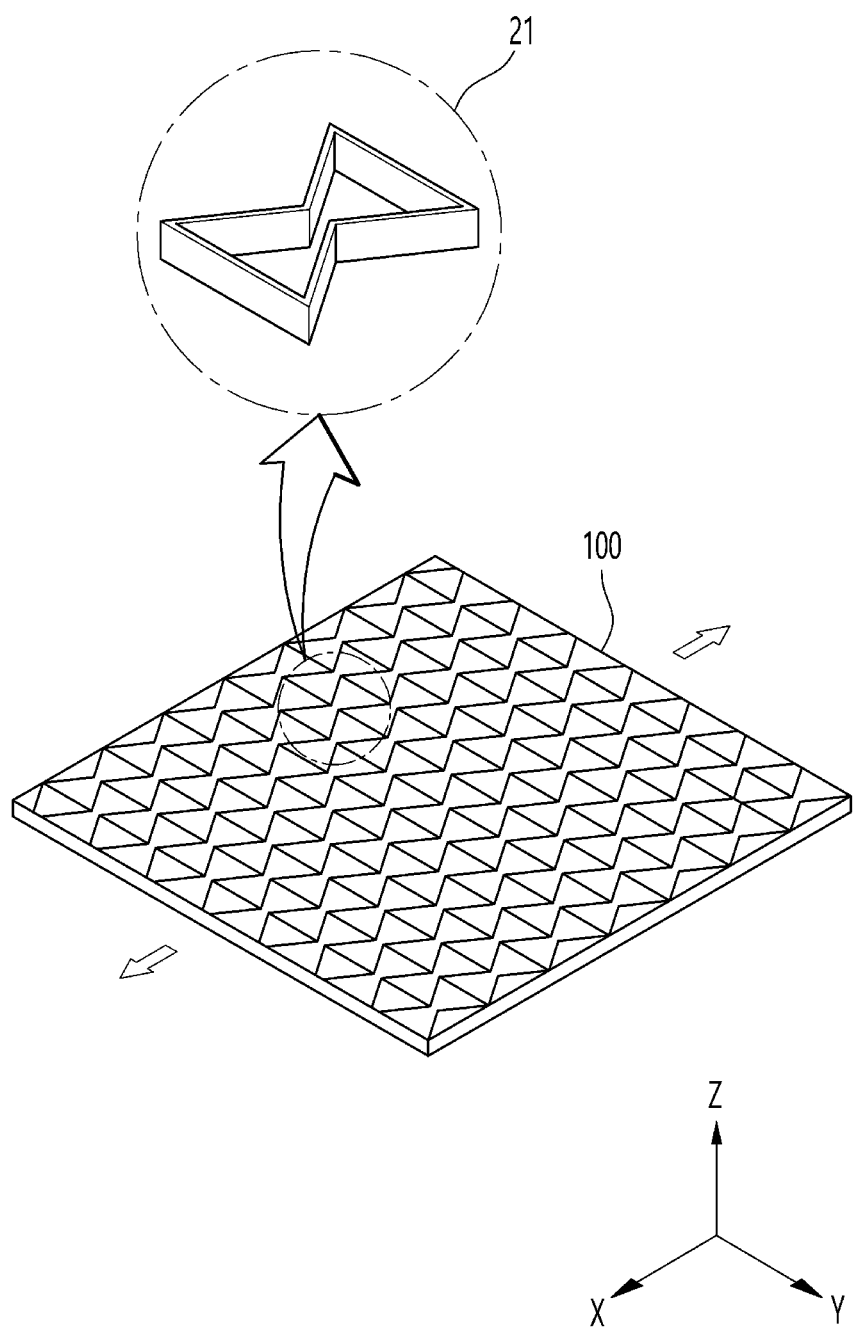
FIG. 2 is an exemplary diagram illustrating a re-entrant auxetic structure according to one embodiment of the present invention.

FIG. 2 is an exemplary diagram illustrating a re-entrant auxetic structure according to one embodiment of the present invention. When the auxetic 20 is provided in the re-entrant structure, each of the plurality of unit structure bodies may have a ribbon shape as shown in FIG. 2. When an external force is applied to a corresponding auxetic 20 based on the longitudinal direction (i.e., when the corresponding auxetic 20 is stretched in one direction), since each of the plurality of unit structure bodies unfolds and thus an internal stress acts in the transverse direction, the corresponding auxetic 20 may have a negative Poisson's ratio. In response to an external force based on an axis in the longitudinal direction, the auxetic 20 may be stretched based on an axis in the transverse direction. In other words, since each of the plurality of unit structure bodies provided inside the auxetic 20 is implemented in a ribbon shape, when an external force is applied based on an axis in one direction, the auxetic 20 may control strain with respect to an axis in another direction.

That is, the auxetic stretchable substrate 100 implemented through the auxetic 20 may be a substrate endowed with a unique mechanical characteristic that is not present in nature by utilizing a new structure body. This may propose a high possibility of utilization in various fields. For example, the auxetic stretchable substrate 100 of the present invention may be applied to a flexible device or a wearable device and may be utilized to maintain an electrical or physical characteristic of a device against an external stress. As another example, when the auxetic stretchable substrate 100 of the present invention is utilized in the display field, the auxetic stretchable substrate 100 may support deformation in multidimensional axial directions in various conditions of being folded or rolled in one direction, away from a fixed-type display. This not only improves the degree of design freedom by providing higher variability, but also secures mechanical stability against an external force.

Figure 3:
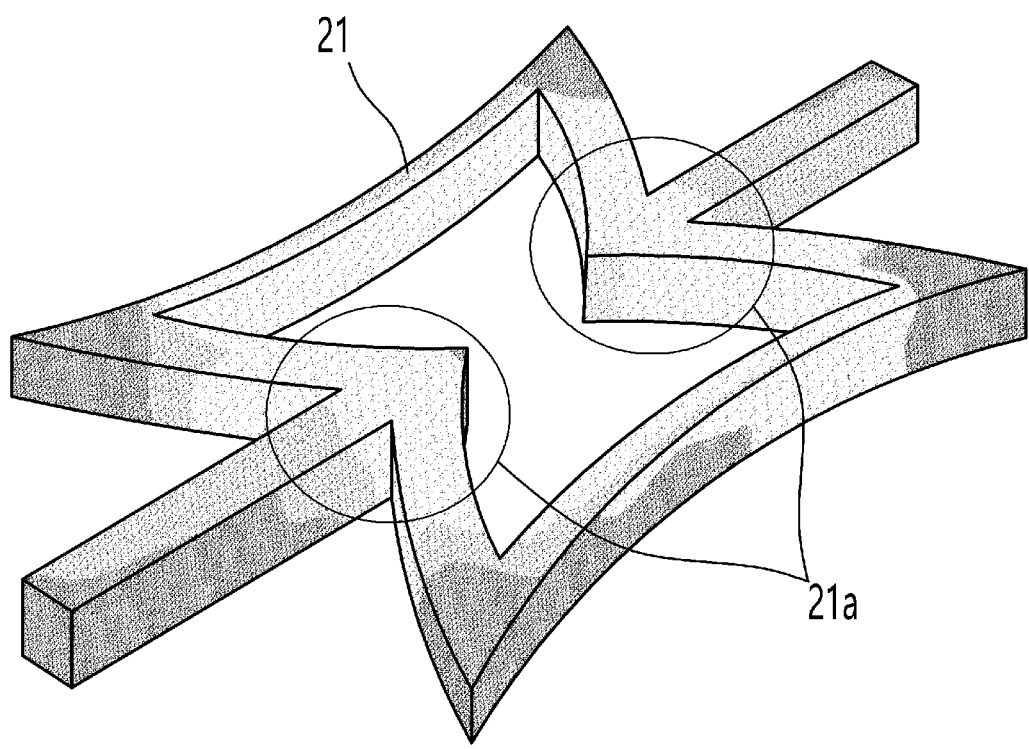
FIG. 3 is an exemplary diagram illustrating that non-uniform stress is applied to a unit structure body according to one embodiment of the present invention.

In terms of the entirety of a substrate, a negative Poisson's ratio of the auxetic stretchable substrate 100 may be controlled, but a stress generated in each region may be non-uniform during stretching. Referring to FIG. 3, a different tensile force may be applied to each region of the unit structure body during stretching. That is, a stress applied to the entirety of the auxetic stretchable substrate 100 formed of a plurality of unit structure bodies may be non-uniform. Specifically, angular momentum applied to an auxetic structure body may be dependent on a re-entrant angle (i.e., a connection angle in each unit structure body). In the embodiment, as the auxetic stretchable substrate 100 is stretched, an angle between the unit structure bodies increases, and thus a larger external stress may be required for an auxetic change. In this case, a phenomenon in which a stress is concentrated in an intersection region 21*a* where three sides intersect in each unit structure body may occur. In other words, when an external stress is applied for stretching, more force may be applied to the intersection region 21*a* where the three sides intersect in each unit structure body. As described above, when a stress concentrated in a specific region occurs, it may cause shearing and delamination of a structure body.

In addition, as shown in FIG. 2, the auxetic stretchable substrate 100 of the present invention may be formed of the auxetic 20 including a plurality of unit structure bodies. In this case, an induced stress may be distributed differently at each position of each unit structure body and cause non-uniform deformation of the unit structure body.

Figure 4:
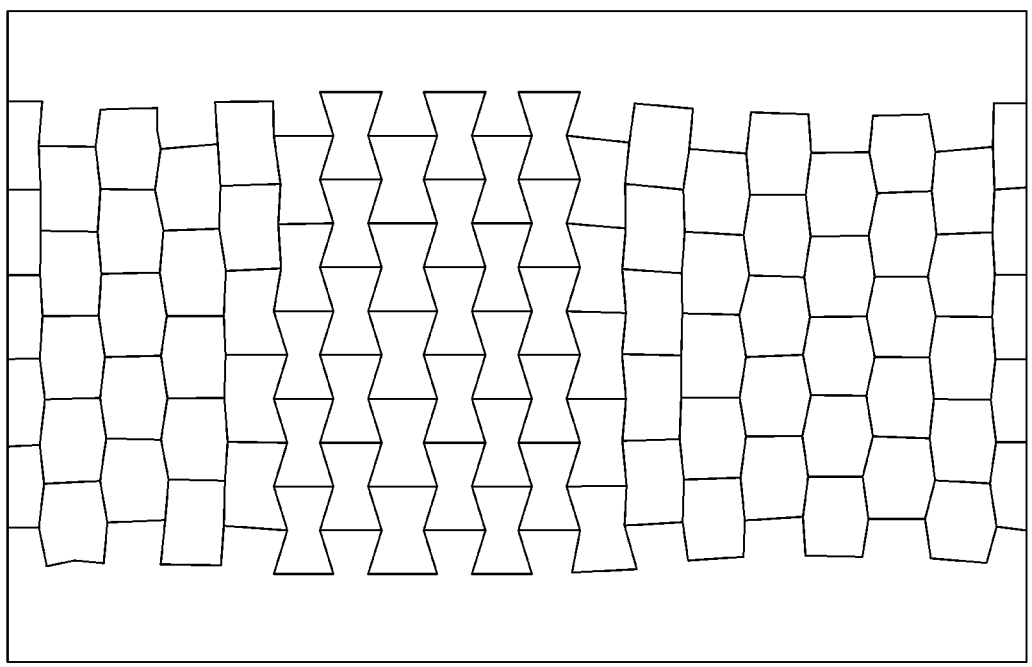
FIG. 4 is an exemplary diagram illustrating that different stress distributions are generated in regions when a substrate is stretched.

More specifically, as shown in FIG. 4, a non-uniform stress may be applied to each unit structure body according to a position of the unit structure body on the substrate. For example, when an external force for stretching is applied, the unit structure bodies placed at an edge are easily stretched, and since the external force is not completely transmitted to the unit structure bodies placed in a central portion, stretching may be difficult. That is, as shown in FIG. 4, edges of both ends may be stretched due to the unit structure bodies which are present at corresponding positions and unfolded, but the central portion may not be stretched because the unit structure bodies present at the corresponding positions are not unfolded. When the substrate is stretched by holding both ends thereof, a stress transferred to each position of each unit structure body is different, and accordingly, a degree of unfolding of each unit structure body may be different.

Figure 5:
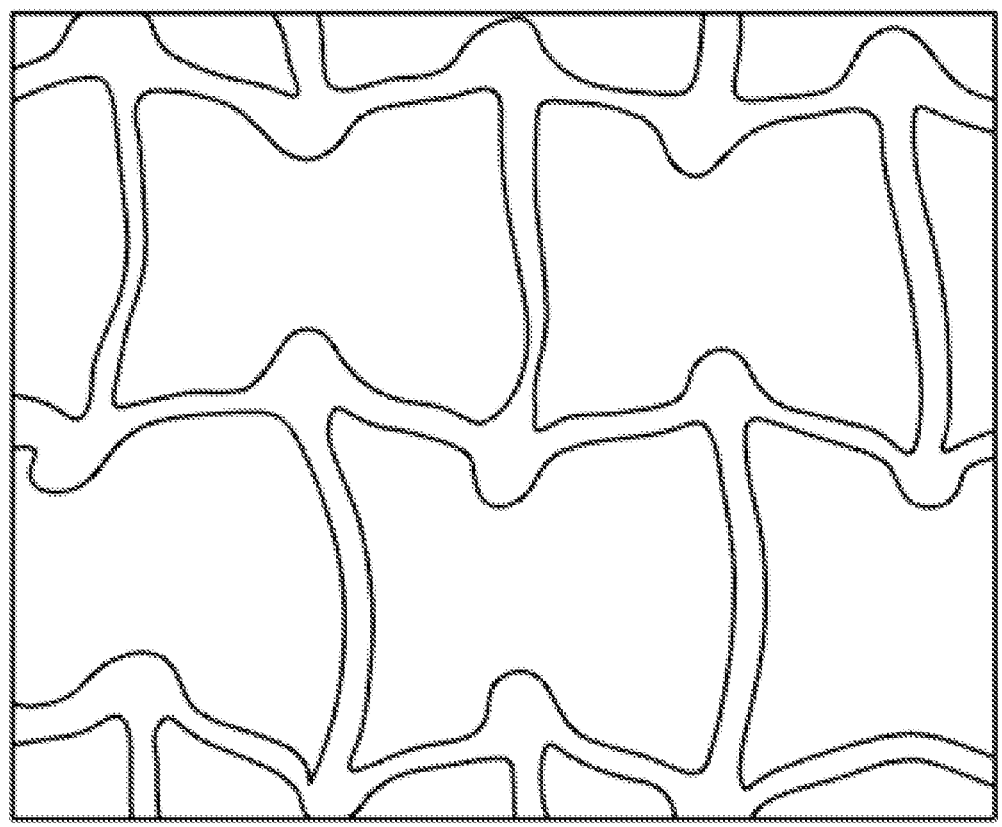
FIG. 5 is an exemplary diagram illustrating that deformation of a structure body is caused by a non-uniform stress distribution according to one embodiment of the present invention.

In other words, since the stress induced in each region of the substrate is non-uniform, stretching may also be non-uniformly generated. Accordingly, as shown in FIG. 5, when the auxetic stretchable substrate 100 is stretched, a deformation deviation may occur in the entirety of the auxetic stretchable substrate 100 and cause distortion.

Additionally, there is a concern in that the performance of a display-related device disposed adjacent to a substrate surface may also be affected. As this accelerates a mechanical separation of a device placed on the stretchable substrate, there is a concern of shortening the lifetime of the device. In particular, when the performance of a device is directly affected by a surface shape, such as a display or a solar cell, a solution to the issue may be required indispensably.

As described above, the objective of the present invention is to provide the auxetic stretchable substrate 100 with a flexible joint structure, which prevents the problem of stress concentration from occurring due to an increase in external stress required for rotation of each unit structure body during stretching and prevents the problem of uneven deformation from occurring due to a distribution of a different induced stress for each position of the substrate.

Hereinafter, each configuration and a manufacturing method of the auxetic stretchable substrate with a flexible joint structure will be described in detail with reference to FIGS. 6 to 15.

Figure 6:
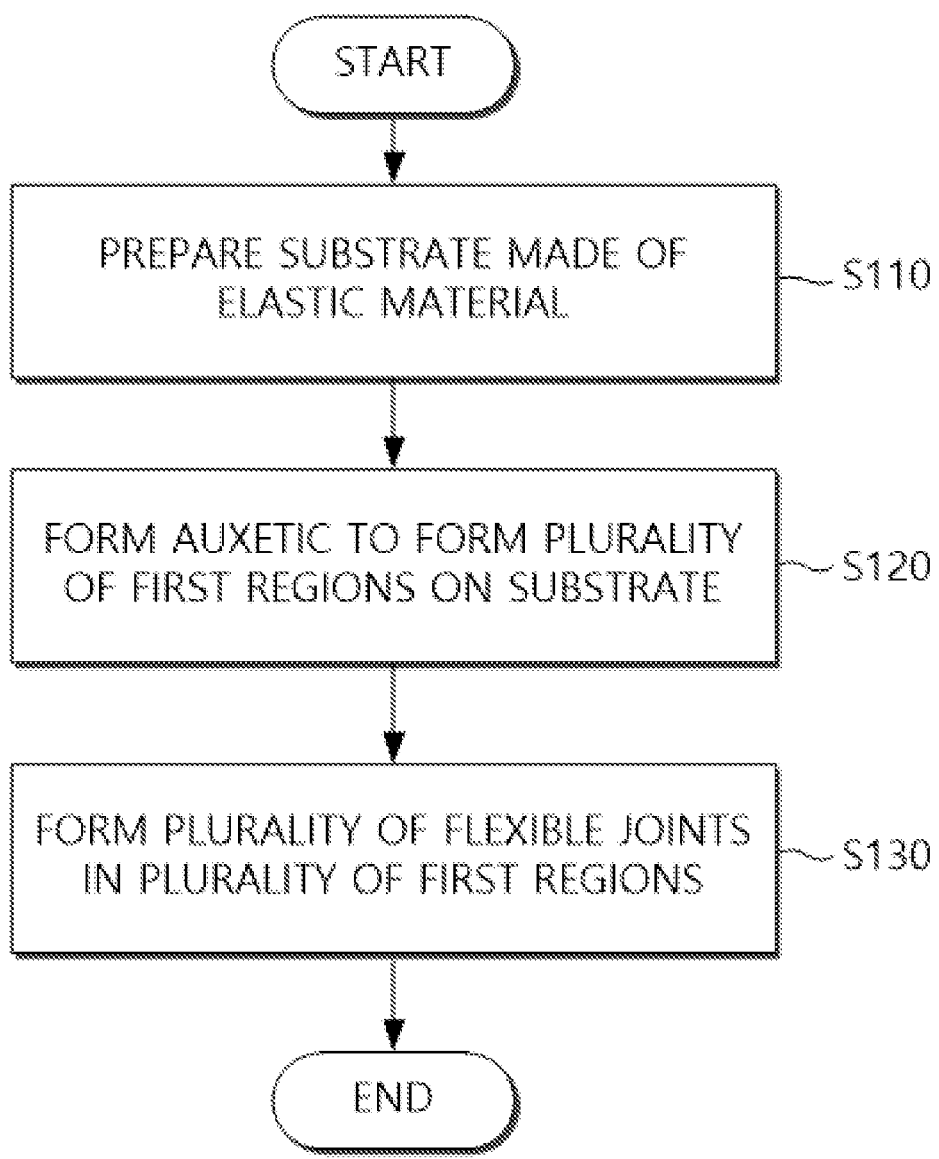
FIG. 6 is an exemplary flowchart illustrating a method of manufacturing an auxetic stretchable substrate with a flexible joint structure according to one embodiment of the present invention.

FIG. 6 is an exemplary flowchart illustrating a method of manufacturing an auxetic stretchable substrate with a flexible joint structure according to one embodiment of the present invention. The order of operations shown in FIG. 6 may be changed as necessary, and one or more operations may be omitted or added. That is, the above operations are merely one example of the present invention, and the scope of the present invention is not limited thereto.

According to one embodiment of the present invention, a method of manufacturing an auxetic stretchable substrate with a flexible joint structure may include preparing a substrate 10 made of an elastic material (S110).

Figure 7A:
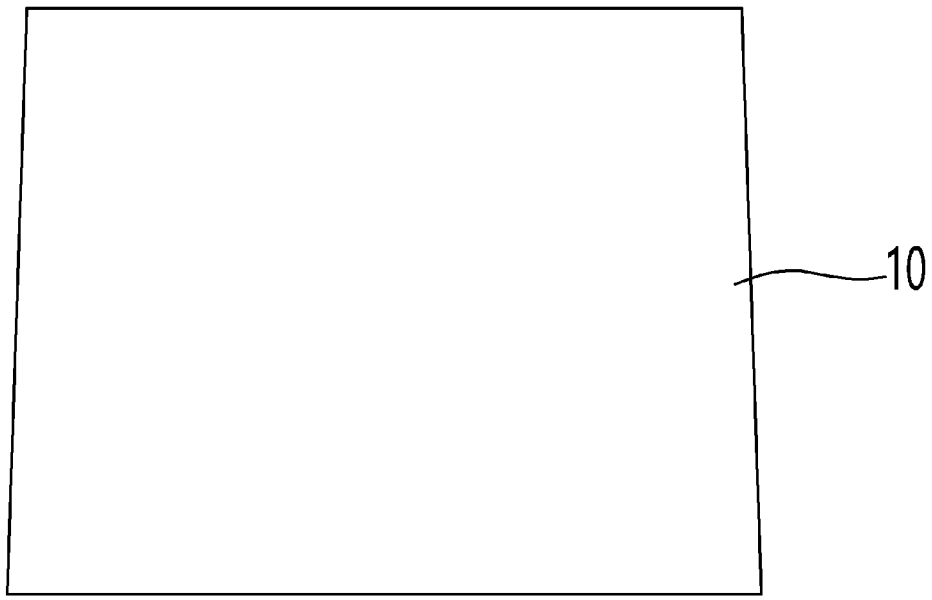
FIG. 7A is an exemplary diagram illustrating a process of manufacturing the auxetic stretchable substrate according to one embodiment of the present invention.

The substrate 10 is provided to support an auxetic 20 in the process of forming the auxetic 20, and as shown in FIG. 7A, the substrate 10 may be prepared in the form of a film having a thin thickness. In addition, the substrate 10 may be formed of an elastic material having elasticity. For example, the substrate 10 may be formed of an elastic material having an elastic modulus that is greater than or equal to a predetermined reference value, such as PDMS, TPU, VHB, butyl rubber, or the like. The detailed description of the above-described substrate is merely an example, and the present invention is not limited thereto. The substrate 10 is used as an elastic film for supporting the auxetic 20 in the process of forming the auxetic 20 and may constitute a lower surface of the auxetic stretchable substrate 100.

According to one embodiment of the present invention, the method of manufacturing an auxetic stretchable substrate with a flexible joint structure may include forming the auxetic 20 to form a plurality of first regions 30 on the substrate 10 (S120). According to one embodiment, the auxetic 20 may be made of a material having strength that is greater than that of the substrate 10. Thus, the auxetic 20 may have a significant influence on deformation of the substrate 10. That is, since the auxetic stretchable substrate 100 including the substrate 10 and the auxetic 20 is significantly affected by the deformation of the auxetic 20 having relatively high strength, the auxetic stretchable substrate 100 may be prepared to have a negative Poisson's ratio. Through the strength of the auxetic, a Poisson's ratio of the substrate according to the present invention may be reduced, and stretching may be possible in various axial directions.

Since the auxetic stretchable substrate 100 of the present invention includes a plurality of unit structure bodies each formed in a specific shape, the auxetic stretchable substrate 100 may cause deformation with respect to another axial direction in response to an external force generated based on one axis. For example, one axis where the external force is generated may be an axis in the transverse direction, and another axis may be an axis in the longitudinal direction coplanarly perpendicular to the one axis where the external force is generated. As a detailed example, when one axis is referred to as an x-axis in a two-dimensional (2D) plane, the other axis may be a y-axis.

According to an embodiment, the auxetic structure of the present invention may be related to a re-entrant structure. As shown in FIGS. 1 to 5, the auxetic may be formed of a plurality of unit structure bodies, each having a re-entrant shape.

For example, as shown in FIG. 2, each of the plurality of unit structure bodies may have a ribbon shape. When an external force is applied to a corresponding auxetic 20 based on the longitudinal direction (i.e., when the corresponding auxetic 20 is stretched in one direction), since each of the plurality of unit structure bodies unfolds and thus an internal stress acts in the transverse direction, the corresponding auxetic 20 may have a negative Poisson's ratio. In response to an external force based on an axis in the longitudinal direction, the auxetic 20 may be stretched based on an axis in the transverse direction. In other words, since each of the plurality of unit structure bodies provided inside the auxetic 20 is implemented in a ribbon shape, when an external force is applied based on an axis in one direction, the auxetic 20 may control strain with respect to an axis in another direction.

That is, the auxetic stretchable substrate 100 implemented through the auxetic 20 may be a substrate endowed with a unique mechanical characteristic that is not present in nature by utilizing a new structure body. This may propose a high possibility of utilization in various fields. For example, the auxetic stretchable substrate 100 of the present invention may be applied to a flexible device or a wearable device and may be utilized to maintain an electrical or physical characteristic of a device against an external stress. As another example, when the auxetic stretchable substrate 100 of the present invention is utilized in the display field, the auxetic stretchable substrate 100 may support deformation in a multidimensional axial direction in various conditions of being folded or rolled in one direction, away from a fixed-type display. This not only improves the degree of design freedom by providing higher variability, but also secures mechanical stability against an external force.

Meanwhile, the auxetic 20 may be generated through a printing process using an elastic material. Here, the printing process is a process of printing a designed circuit pattern on a target object through an inkjet printer or laminator and may be a roll-to-roll process of forming (or stacking) a specific lattice structure (i.e., a plurality of unit structure bodies having specific shapes) through a stretchable or elastic material. The printing process may be a process using, for example, an inkjet device, a pneumatic dispenser, a screw dispenser, a screen printing device, a bar coater, or a stray printing device. The detailed descriptions of the devices used in the above-described printing process are merely examples, and the present invention is not limited thereto.

That is, the auxetic 20 constituting the auxetic stretchable substrate 100 of the present invention may be generated through the printing process using an elastic material. In other words, through the printing process, it is possible to form an auxetic corresponding to an interval and a size ranging from tens to hundreds of microns. This can provide a high degree of design freedom and a high degree of material freedom, and simultaneously, high efficiency in a large-area process.

In addition, in the embodiment, an interval or height at which the auxetic 20 is inserted may be controlled through the printing process. When the auxetic stretchable substrate 100 prepared through the corresponding process is stretched, it is possible to control strain with respect to one axis or another axis perpendicular to the one axis. That is, the auxetic 20 of the present invention may be characterized in that the strain with respect to the other axis is controlled on the basis of a period between the plurality of unit structure bodies or a thickness of each of the plurality of unit structure bodies. The period between the plurality of unit structure bodies is an interval between the plurality of unit structure bodies or a size of each unit structure body. For example, the period between the plurality of unit structure bodies being short may mean that the size of each unit structure body is relatively small and thus the plurality of unit structure bodies are formed at close intervals. That is, the period between the unit structure bodies may be inversely proportional to the number of the unit structure bodies included per unit area. In other words, the period between the unit structure bodies being long may mean that the number of the unit structure bodies included per unit area is small, whereas the period between the unit structure bodies being short may mean that the number of the unit structure bodies included per unit area is large. In addition, the thickness of each of the plurality of unit structure bodies may be a thickness or a depth of each unit structure body within the auxetic stretchable substrate 100.

Specifically, in response to an external force generated based on one axis, it is possible to determine strain induced in another axis. In addition, a period between the plurality of unit structure bodies or a thickness of each of the plurality of unit structure bodies may be determined on the basis of the determined strain. In addition, the auxetic may be generated by performing a printing process corresponding to the period or the thickness.

That is, the period between the plurality of unit structure bodies included in the auxetic 20 or the thickness of each of the plurality of unit structure bodies may be in relation to strain control with respect to another axis. As a detailed example, when the period between the plurality of unit structure bodies included in the auxetic 20 is short, the strain with respect to the other axis may become larger. In addition, when the period between the plurality of unit structure bodies included in the auxetic 20 is long, the strain with respect to the other axis may become smaller.

That is, because the number of the unit structure bodies included per unit area is relatively large when the period between the plurality of unit structure bodies is relatively short, when an external force occurs in one axial direction, strain with respect to another axis may become larger. For example, when an external force is generated based on an axis in the transverse axis (e.g., an x-axis) in the auxetic 20 in which a period between the plurality of unit structure bodies is relatively short, deformation corresponding to the number of the unit structure bodies (i.e., relatively large mechanical deformation) may occur with respect to an axis in the longitudinal direction (e.g., a y-axis) perpendicular to the axis where the external force is generated. Conversely, because the number of the unit structure bodies included per unit area is relatively small when the period between the plurality of unit structure bodies is relatively long, when a tension force occurs with respect to one axis, strain with respect to another axis may become smaller. In addition, for example, when an external force is generated based on the axis in the transverse axis (e.g., the x-axis) in the auxetic 20 in which a period between the plurality of unit structure bodies is relatively long, deformation corresponding to the number of the unit structure bodies (i.e., relatively large mechanical deformation) may occur with respect to the axis in the longitudinal direction (e.g., the y-axis) perpendicular to the axis where the external force is generated.

In addition, when a thickness of the auxetic 20 is large, the strain with respect to another axis may become large. In addition, when the thickness of the auxetic 20 is small, the strain with respect to another axis may become small.

In other words, according to the present invention, in the printing process of generating the auxetic 20, the period between the plurality of unit structure bodies or the thickness of each of the plurality of unit structure bodies is determined differently, it is possible to control a degree of deformation (i.e., strain) occurring with respect to another axis in response to the external force generated with respect to one axis.

For example, when the auxetic stretchable substrate 100 including the auxetic 20 is used in the display field, the deformation in a direction of another axis corresponding to the external force generated with respect to one axis may cause distortion of a stretchable display screen. Accordingly, the auxetic stretchable substrate 100 having small strain in the direction of another axis in response to the external force generated with respect to one axis may be required. In this case, according to the present invention, during the process, the period between the plurality of unit structure bodies is determined to be short or the thickness of each of the plurality of unit structure bodies is determined to be large so that the strain generated with respect to another axis may be controlled. That is, since the auxetic stretchable substrate 100 of the present invention is prepared according to a need of a user to utilize the period between the plurality of unit structure bodies or the thickness of each of the plurality of unit structure bodies, the auxetic stretchable substrate 100 may be a substrate of which the strain occurring with respect to another axis can be controlled.

In an additional example, the auxetic stretchable substrate 100 may include the auxetic 20 having one or more divided regions, and a unit structure body having a different period or thickness may be formed to correspond to each divided region. In this case, the one or more divided regions may be regions divided on the basis of an arrangement of elements in conjunction with the auxetic stretchable substrate 100. For example, in the auxetic stretchable substrate 100, a region where many elements in conjunction with the auxetic stretchable substrate 100 are expected to be disposed may be composed of a unit structure body having a different period or thickness from other regions. That is, a unit structure body having a period or thickness different from those of other regions is formed in a region expected to be most affected by strain because elements are intensively disposed to control strain so that an effect of securing stability of connection between the elements can be provided. For example, in the region where the elements are intensively disposed, the strain may be minimized by determining the period between the plurality of unit structure bodies to be short or determining the thickness of each of the plurality of unit structure bodies to be large.

That is, the auxetic 20 may be generated by performing the printing process using an elastic material on an upper portion of the substrate 10. In other words, the auxetic 20 may be generated by forming the plurality of unit structure bodies, each having a specific shape, through the printing process using an elastic material on the upper portion using the substrate 10 as a support. In this case, as described above, the period between the plurality of unit structure bodies or the thickness of each of the plurality of unit structure bodies constituting the auxetic 20 may be determined on the basis of strain to be controlled with respect to a direction of another axis.

According to one embodiment, the substrate 10 and the auxetic 20 may include the same elastic material. For example, the auxetic stretchable substrate 100 of the present invention may be used in the display field. When the auxetic 20 and the substrate 10 constituting auxetic stretchable substrate 100 are formed of different materials in an application condition, since a difference in refractive index between the auxetic 20 and the substrate 10 is generated, there is a concern that resolution of a displayed screen will be degraded. For example, when the substrate 10 and the auxetic 20 are formed of different materials, a difference in refractive index between the different materials is generated and it may be difficult to secure visibility, such as exposure of an aspect of the auxetic 20 formed in the substrate 10.

Accordingly, the auxetic stretchable substrate 100 of the present invention may be characterized by including the auxetic 20 and the substrate 10 which are formed of the same material. For example, when the auxetic 20 includes a mechanical PDMS metamaterial, the substrate 10 coupled to the auxetic 20 may include the same mechanical PDMS material. That is, by minimizing the difference in refractive index between the auxetic 20 and the substrate 10, it is possible to secure transparency and provide the auxetic stretchable substrate 100 with improved visibility in the display application field. Therefore, since the auxetic stretchable substrate 100 of the present invention is prepared in consideration of a refractive index between materials, improved transparency can be provided. In addition, since the auxetic 20 and the substrate 10 are formed of the same material, adhesion can be improved during bonding or impregnation of the materials so that stability and durability can be secured. The detailed description of the material constituting the above-described auxetic and substrate is merely an example, and the present invention is not limited thereto.

Figure 7B:
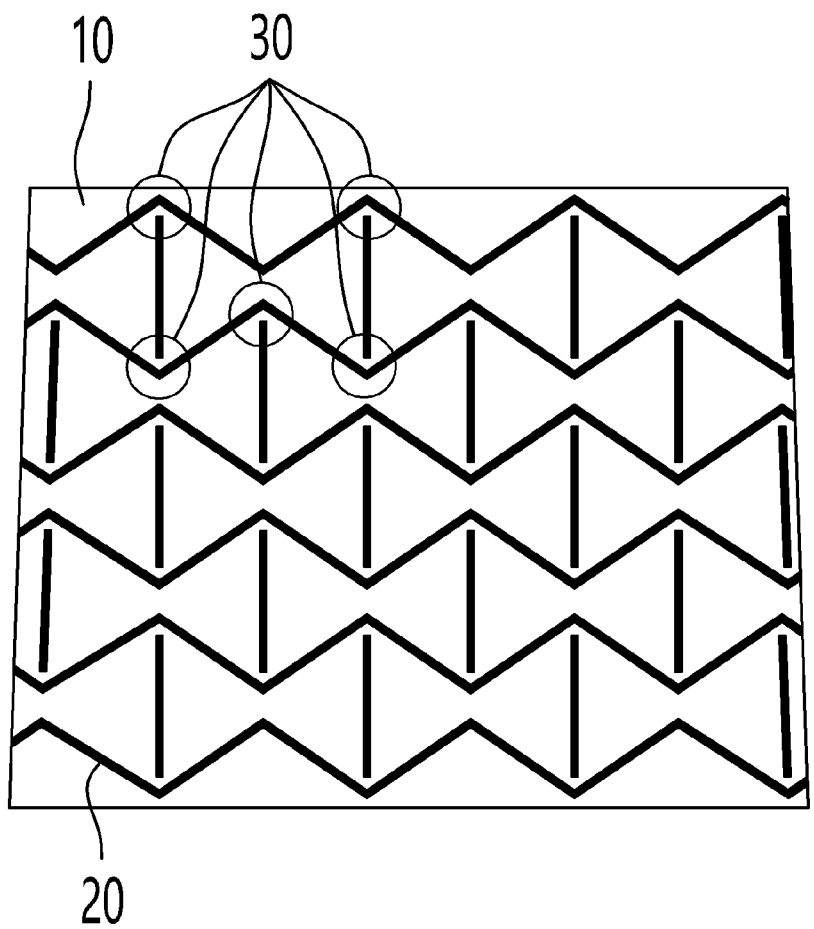
FIG. 7B is an exemplary diagram illustrating a process of manufacturing the auxetic stretchable substrate according to one embodiment of the present invention.

According to one embodiment of the present invention, the auxetic 20 may be prepared to form a plurality of first regions. Specifically, the auxetic 20 may be formed on one surface of the substrate 10 through a printing process. The printing process proceeds to form the auxetic 20, and as shown in FIG. 7B, the printing process may be performed to form the plurality of first regions 30. For example, the first region 30 may be a region in which a material constituting an auxetic is not printed. In the embodiment, at least some of the plurality of first regions 30 may have different lengths. Further, in the embodiment, a material (e.g., a flexible joint) having a Young's modulus different from that of the auxetic may be printed on the first region 30. That is, at least some of flexible joints formed in the plurality of first regions may have different Young's moduli.

According to one embodiment, the plurality of first regions 30 may relate to intersections in the auxetic 20. The first region 30 may be formed in an intersection region where a plurality of sides forming each unit structure body intersect. In the embodiment, the plurality of first regions 30 may each correspond to a point where sides of each unit structure body meet. The first region 30 may be formed at an end portion of each of the sides of each unit structure body.

In a detailed example, the plurality of first regions 30 may each be one region corresponding to both ends of each of the sides facing each other in each unit structure body.

Figure 8:
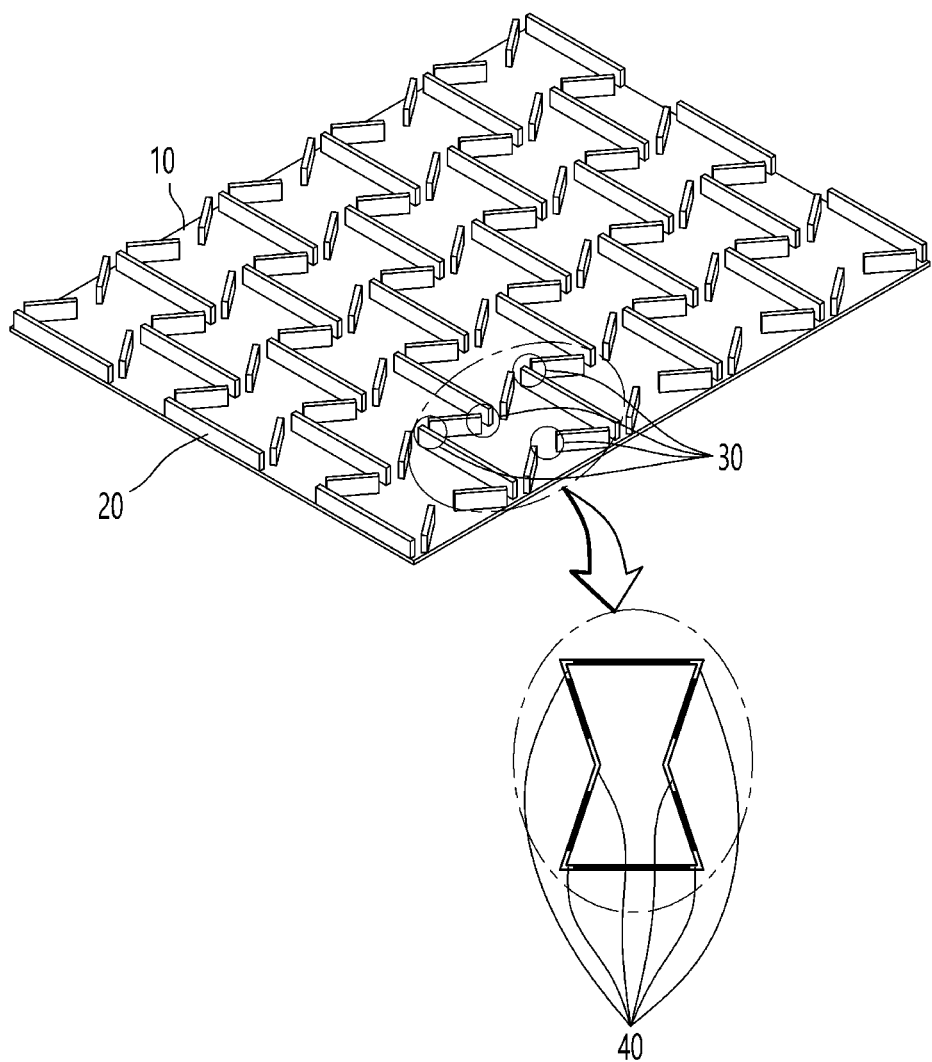
FIG. 8 is an exemplary diagram for describing positions of a plurality of flexible joints according to one embodiment of the present invention.

As a more detailed example, referring to FIG. 8, when an auxetic is implemented through a re-entrant structure, sides facing each other in one unit structure body may be paired. In this case, both ends of each of the pair of sides facing each other may be regions in which the plurality of first regions are formed. For example, in a ribbon shape, vertexes may be regions in which the plurality of first regions are formed. The first regions 30 may be formed in at least some of the end portions of the sides provided in each unit structure body.

Meanwhile, as the auxetic stretchable substrate 100 is stretched, an angle between the unit structure bodies increases, and thus a larger external stress may be required for an auxetic change. In this case, a phenomenon in which a stress is concentrated in an intersection region where three sides intersect in each unit structure body may occur. In other words, when an external stress is applied for stretching, more force may be applied to the intersection region where the three sides intersect in each unit structure body. As described above, when a stress concentrated in a specific region occurs, it may cause shearing and delamination of a structure body.

In the embodiment, during stretching, the plurality of first regions may relate to regions in which a stress is concentrated. The printing process is performed using regions where a stress is concentrated as the plurality of first regions during stretching so that the auxetic of the present invention may be formed. Accordingly, as shown in FIG. 7B, the auxetic of the present invention may be formed on one surface of the substrate 10 in a state in which regions relating to an intersection of three sides (i.e., the plurality of first regions) are not connected. That is, unit structure bodies may be formed in a state in which some regions are not connected.

According to one embodiment of the present invention, the method of manufacturing an auxetic stretchable substrate with a flexible joint structure may include forming a plurality of flexible joints 40 in the plurality of first regions 30 (S130).

Figure 7C:
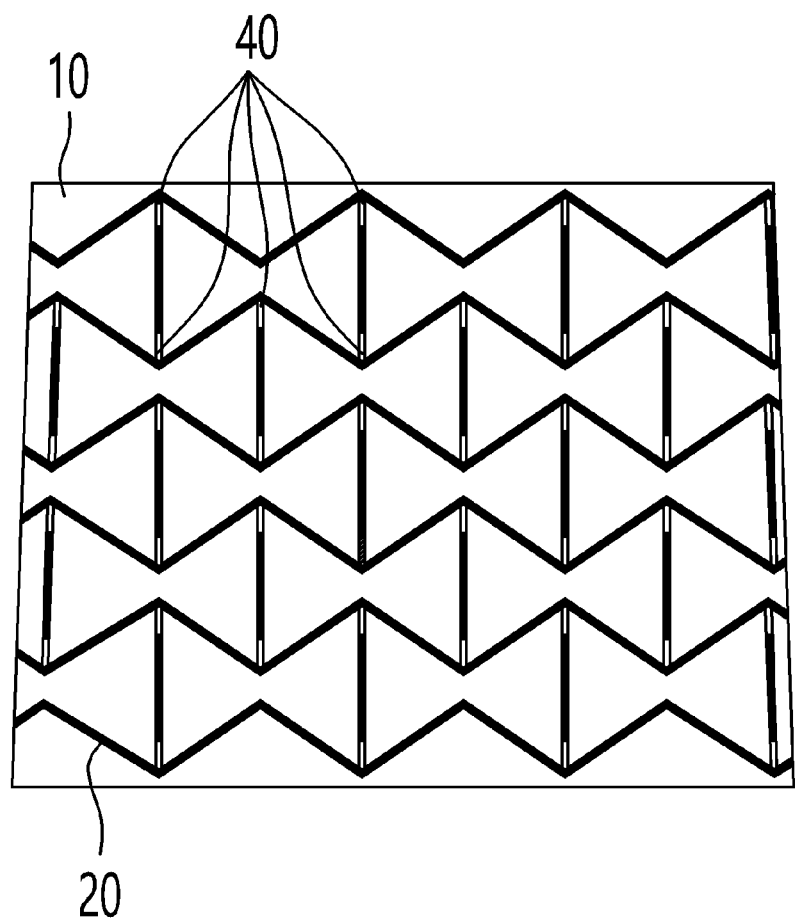
FIG. 7C is an exemplary diagram illustrating a process of manufacturing the auxetic stretchable substrate according to one embodiment of the present invention.

As shown in of FIG. 7C, the plurality of flexible joints 40 may be formed in the plurality of first regions 30 formed in the auxetic 20. By the first region corresponding to a partially empty space being filled with the flexible joint when the auxetic is formed, a shape of each unit structure body may be completed. The plurality of flexible joints 40 are formed to be coupled to the auxetic 20 through the printing process. Specifically, the plurality of flexible joints 40 are printed on the plurality of first regions 30, formed in contact with the auxetic 20, and coupled to the auxetic 20 through curing. Here, the curing may be curing for coupling between each flexible joint 40 and the auxetic 20.

In various examples, a length of the auxetic should be provided to be relatively long compared to a length of the flexible joint. As an example of one axis, the auxetic should be prepared to have a length that is greater than that of the flexible joint. For example, when the length of the flexible joint is greater than the length of the auxetic (that is, when the auxetic is shorter than the flexible joint), appropriate stretching in relation to a negative Poisson's ratio may not be achieved due to a decrease in elasticity in a corresponding region.

In the embodiment, the plurality of flexible joints 40 may each be formed of a material with an elastic modulus that is relatively lower than that of the auxetic 20. Since the plurality of flexible joints 40 are each formed of the material with an elastic modulus that is relatively lower than that of the auxetic 20, when the substrate is stretched, regions provided with the flexible joints 40 may be more easily stretched than regions provided with the auxetic 20. This is to uniformize an induced stress by facilitating stretching in a specific region (i.e., a region in which a stress corresponding to the plurality of first regions is concentrated) on the unit structure body. According to the embodiment, the flexible joint may be formed to have a Young's modulus ranging from 1 kPa to 10 Mpa.

In one embodiment, the auxetic 20 may be made of ethylene-vinyl acetate (EVA), a silicone elastomer, or polyurethane (PU), which has relatively high mechanical stiffness among elastomer-based materials, and the flexible joint 40 may be made of butyl, isoprene, or neoprene rubber. However, the detailed examples of the above-described auxetic and flexible joints are some examples considering only mechanical properties, and more diverse materials may be used when additional factors such as a refractive index deviation between materials and a bonding characteristic are considered. In various examples, the flexible joint and the auxetic may be formed using the same material having a small refractive index deviation and an excellent bonding characteristic according to a design condition, but having a large deviation in mechanical property according to a molecular structure and a crosslinking characteristic.

That is, in the auxetic stretchable substrate 100 of the present invention, a region where a stress is concentrated in the structure relating to the auxetic 20 may be selected as a first region, and the flexible joint 40 may be formed of a material with an elastic modulus that is smaller than that of a material constituting the auxetic 20 in the corresponding first region. In this case, a portion where the flexible joint 40 is formed may be deformed with a smaller force than the auxetic 20 and a stress concentration may not occur. Since a flexible joint with a relatively low elastic modulus is provided to connect the auxetic (i.e., the flexible joint is provided to connect each first region), an anisotropic stiffness factor is increased and a change of each unit structure body may occur more in a low stress condition.

According to the present invention, in the process of forming the auxetic, specific regions (i.e., the plurality of first regions) may be secured to prevent a stress concentration from occurring due to the structure of the auxetic when stretched, and the plurality of flexible joints are each formed of a material with an elastic modulus that is smaller than that of the auxetic so that a stress concentration due to stretching can be minimized. This has an advantage of improving the lifetime and stretching efficiency of the substrate by preventing shearing and delamination of the structural body due to the stress concentration.

According to one embodiment, the length of each of the plurality of flexible joints is shortened as a deviation in Young's modulus between the flexible joint and the auxetic increases. In addition, in the embodiment, as the length is increased relative to that of the auxetic, the plurality of flexible joints are each formed to have a smaller Young's modulus.

Figure 9A:
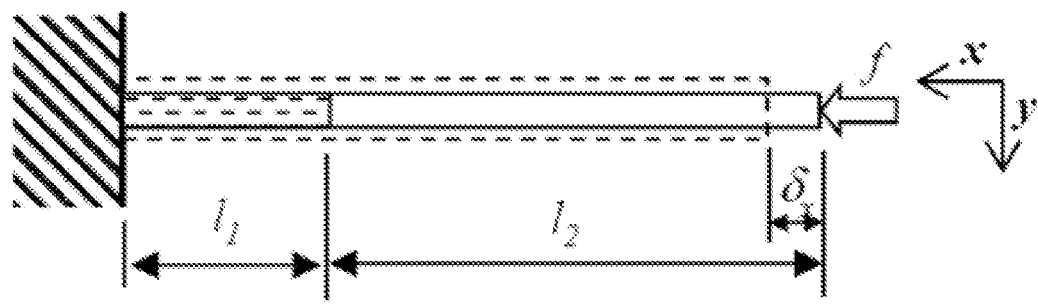
FIG. 9A is an exemplary diagram for describing a length and a Young's modulus of each material for maximizing an anisotropic stiffness factor according to one embodiment of the present invention.
Figure 9B:
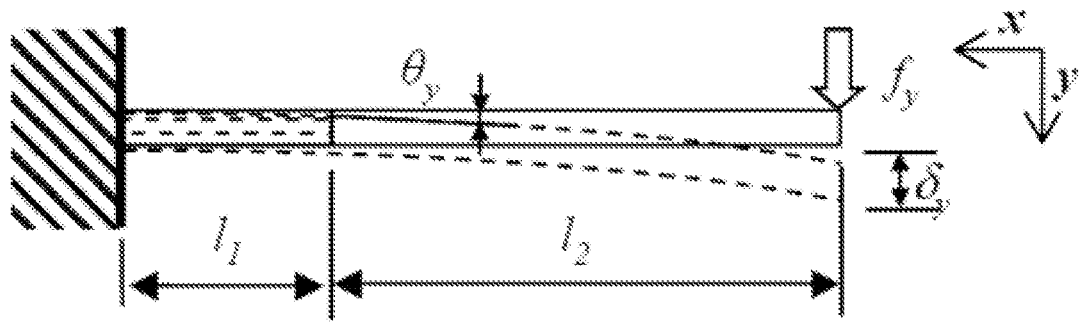
FIG. 9B is an exemplary diagram for describing a length and a Young's modulus of each material for maximizing an anisotropic stiffness factor according to one embodiment of the present invention.

More specifically, the relative lengths and Young's moduli of the regions of the flexible joint 40 and auxetic 20 may be affected interdependently. For example, referring to FIG. 9, the anisotropic stiffness factor between materials may be expressed through the following equations. FIG. 9A is an exemplary diagram for describing a case in which a compressive force is applied when provided through bonding between two materials, and FIG. 9B is an exemplary diagram for describing a case in which a force relating to bending is applied when provided through the bonding between the two materials.

$$\delta_x = \frac{f_x l_1}{E_1} + \frac{f_x l_2}{E_2} = \frac{f_x l_1}{E_1} + \frac{f_x l_2}{kE_1} = f_x \left( \frac{l_1}{E_1} + \frac{l_2}{kE_1} \right)$$

$$S_x = \frac{f_x}{\delta_x} = \frac{E_1}{l_1 + (l_2/k)}$$

$$\delta_y = \frac{4 f_y l^3}{E_1} \left( 1 - \frac{2}{3} l_2 + \frac{l_2^3}{2l^3} \right) + \frac{4 f_y l_2^3}{kE_1} + \frac{6 f_y l_1 l_2 (l_1 + 2l_2)}{E_1}$$

$$S_y = \frac{E_1}{4l^3 \left( 1 - \frac{2}{3} l_2 + \frac{l_2^3}{2l^3} \right) + (4l_2^3/k) + 6l_1 l_2 (l_1 + 2l_2)}$$

Here, $\delta_x$ may denote x-axis deformation due to a compression force, and $\delta_y$ may denote y-axis deformation due to a bending force. In addition, $S_x$ may denote x-axis stiffness, and $S_y$ may denote y-axis stiffness. In addition, k may mean $E_1/E_2$. k may relate to a Young's modulus of the flexible joint and a Young's modulus of the auxetic and may relate to a deviation between two materials. For example, since a k value increases as $E_2$ increases or $E_1$ decreases, this may mean that a Young's modulus deviation between the two materials increases as the k value is calculated to increase. Conversely, since the k value decreases as $F_2$ decreases or $E_1$ increases, this may mean that the Young's modulus deviation between the two materials decreases as the k value is calculated to decrease.

In addition, when referring to the above equations, Z which is an anisotropic stiffness factor may be expressed as follows.

$$Z = \frac{S_x}{S_y} = \frac{4l^3\left(1 - \frac{2}{3}l_2 + \frac{l_2^3}{2l^3}\right) + (4l_2^3/k) + 6l_1 l_2(l_1 + 2l_2)}{l_1 + (l_2/k)}$$

Here, when l=1, $l_1$=x, and $l_2$=1−x, it may be solved as follows.

$$Z = \frac{4\left(1 - \frac{2}{3}(1-x) + \frac{1}{2}(1-x)^3\right) + (4(1-x)^3/k) + 6x(1-x)(2-x)}{x1\{(1\ x)/k\}},$$

$$0 < x < 1$$

When the k value is changed in the above equation and x having the maximum value is obtained, it is as follows.

In one embodiment, when k=2, Z which is the anisotropic stiffness factor may have the maximum value when $x(l_1)$ is 0.35. That is, when the Young's moduli of the materials differ by a factor of 2, the anisotropic stiffness factor may be maximized when the two materials are provided at a length ratio of 35:65.

Further, in one embodiment, when k=10, Z which is the anisotropic stiffness factor may have the maximum value when $x(l_1)$ is 0.2. That is, when the Young's moduli of the materials differ by a factor of 10, the anisotropic stiffness factor may be maximized when the two materials are provided at a length ratio of 20:80.

Further, in one embodiment, when k=100, Z which is the anisotropic stiffness factor may have the maximum value when $x(l_1)$ is 0.07. That is, when the Young's moduli of the materials differ by a factor of 100, the anisotropic stiffness factor may be maximized when the two materials are provided at a length ratio of 7:93.

Further, in one embodiment, when k=1000, Z which is the anisotropic stiffness factor may have the maximum value when $x(l_1)$ is 0.02. That is, when the Young's moduli of the materials differ by a factor of 10, the anisotropic stiffness factor may be maximized when the two materials are provided at a length ratio of 2:98.

That is, looking at the above-described embodiment, in order to maximize the anisotropic stiffness factor, as the Young's modulus deviation between the flexible joint and the auxetic becomes large, the flexible joint should be provided to have a shorter length, and as the Young's modulus deviation between the flexible joint and the auxetic becomes small, the flexible joint should be provided to have a longer length.

In other words, according to the present invention, in response to the Young's modulus deviation between the flexible joint and the auxetic, the length of the flexible joint may be determined to maximize the anisotropic stiffness factor. Accordingly, the anisotropic stiffness factor may be maximized so that rotation of a frame may be generated more easily even in a low stress condition. This has an effect of inducing a uniform stress distribution in the entirety of the substrate by preventing a stress from being concentrated in the first region.

Figure 10:
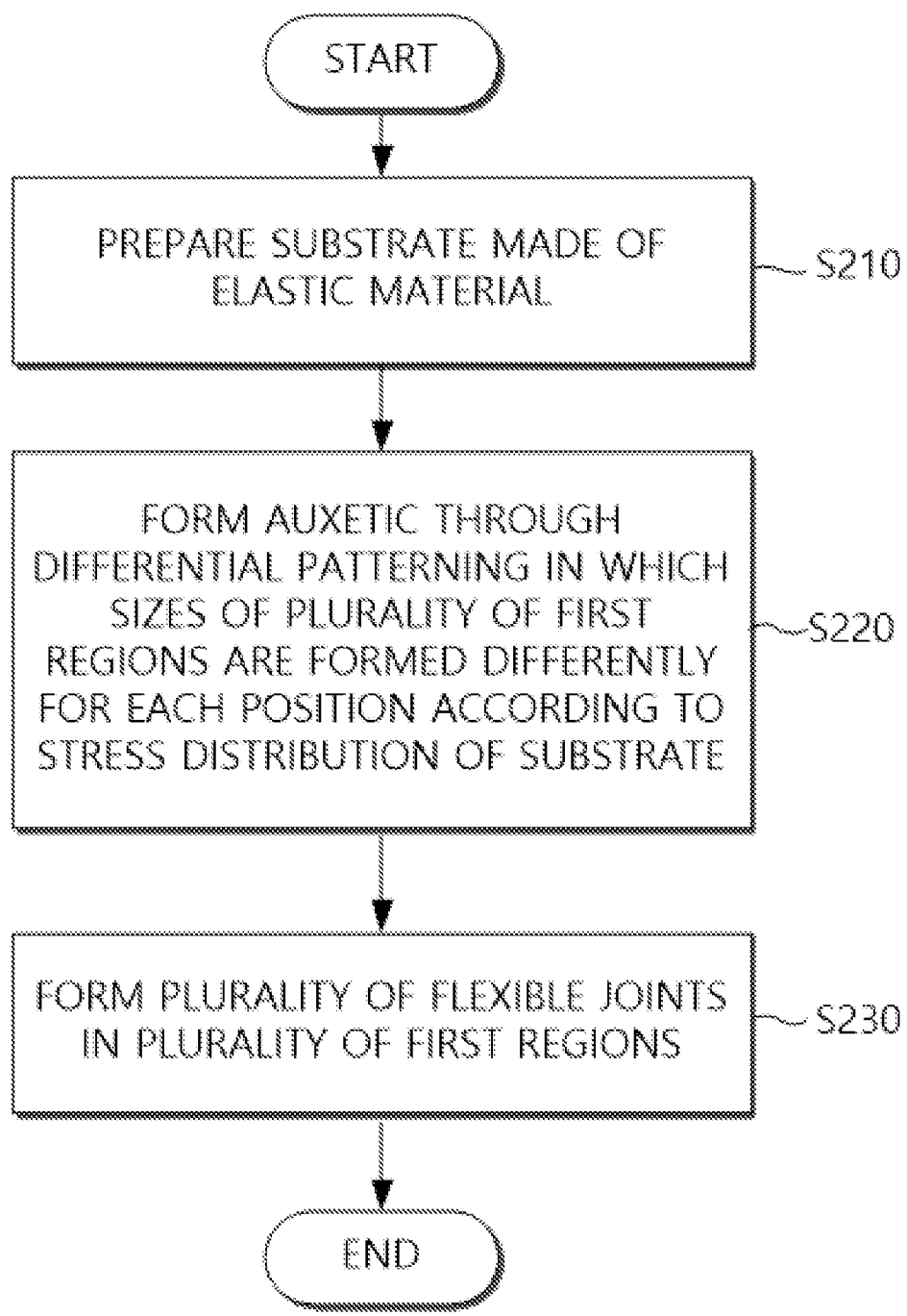
FIG. 10 is an exemplary flowchart illustrating a method of manufacturing an auxetic stretchable substrate with a flexible joint structure according to another embodiment of the present invention.

FIG. 10 is an exemplary flowchart illustrating a method of manufacturing an auxetic stretchable substrate with a flexible joint structure according to another embodiment of the present invention. The order of operations shown in FIG. 10 may be changed as necessary, and one or more operations may be omitted or added. Among features of the content shown in FIG. 10, for features identical to those described above in relation to FIGS. 6 to 9, the content described in FIGS. 6 to 9 can be referred to, and description thereof will be omitted herein.

According to another embodiment of the present invention, a method of manufacturing an auxetic stretchable substrate with a flexible joint structure may include preparing a substrate 10 made of an elastic material (S210).

According to another embodiment of the present invention, the method of manufacturing an auxetic stretchable substrate with a flexible joint structure may include forming an auxetic through differential patterning in which sizes of a plurality of first regions are formed differently for each position according to a stress distribution of the substrate (S220). Through the differential patterning, at least some of the plurality of first regions may have different lengths. Accordingly, each of the plurality of first regions may be provided with a different length for each region on the substrate.

As a more detailed example, as shown in FIG. 4, a non-uniform stress may be applied to each unit structure body according to a position of the unit structure body on the substrate. For example, when an external force for stretching is applied, the unit structure bodies placed at an edge are easily stretched, and since the external force is not completely transmitted to the unit structure bodies placed in a central portion, stretching may be difficult. That is, as shown in FIG. 4, edges of both ends may be stretched due to the unit structure bodies which are present at corresponding positions and unfolded, but the central portion may not be stretched because the unit structure bodies present at the corresponding positions are not unfolded. In other words, since the stress induced in each region of the substrate is non-uniform, stretching may also be non-uniformly generated.

As described above, the stress applied to each unit structure body may be different for each position of the substrate, and such a non-uniform stress may cause different stretching for each position. Due to such stress tailoring, relatively small deformation of the structure body is induced toward a central region of the substrate when compared to an edge region. Thus, it may be difficult to control a uniform Poisson's ratio with respect to the entirety of the substrate. That is, as shown in FIG. 5, each unit structure body in the substrate may be deformed into a different shape.

Therefore, according to the present invention, sizes of regions where the flexible joints are formed, that is, the plurality of first regions 30, may be determined differently for each region (or each position) of the substrate. This is to form the sizes of the flexible joints, which are formed to correspond to each region, differently for each region.

Figure 11:
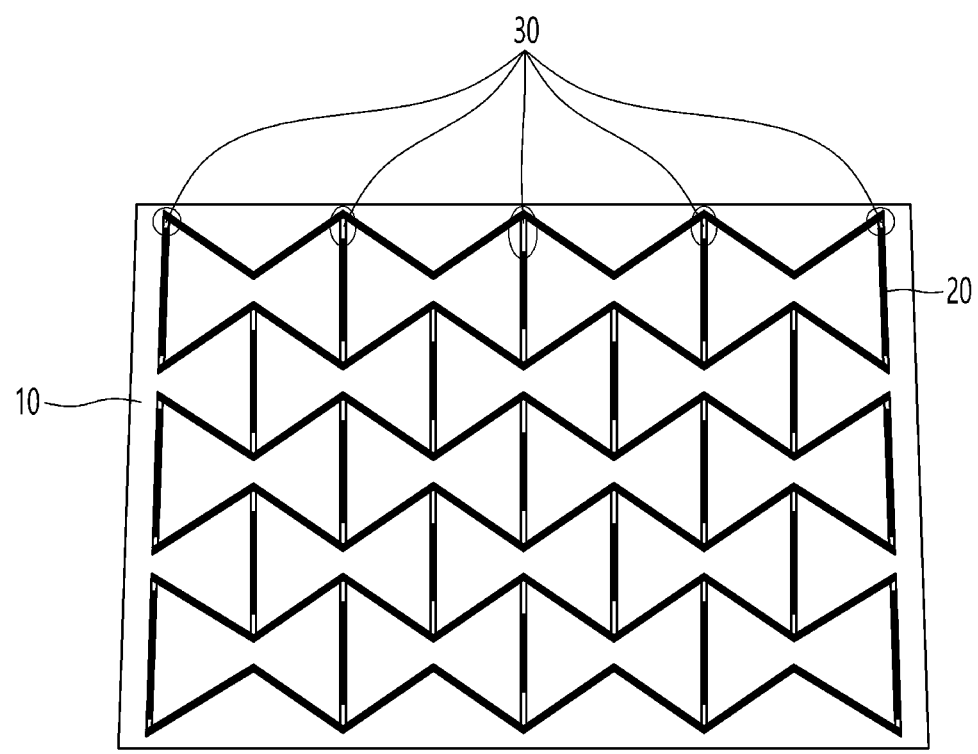
FIG. 11 is an exemplary diagram illustrating that sizes of first regions are implemented differently through differential patterning for each region according to one embodiment of the present invention.

In a specific example, the sizes of the plurality of first regions may be formed to be larger from the edge toward the central portion. That is, as shown in FIG. 11, the first regions are formed with relatively long lengths in the central region, and the lengths of the first regions may become shorter toward the edge. In other words, the length of the first region may be shortened from the central portion to the edge of the substrate, and conversely, the length of the auxetic may be increased.

According to another embodiment of the present invention, the method of manufacturing an auxetic stretchable substrate with a flexible joint structure may include forming a plurality of flexible joints 40 in the plurality of first regions 30 (S230).

As described above, the sizes (or lengths) of the plurality of first regions 30 may be formed differently for each region. According to the present invention, the plurality of flexible joints 40 may be formed to correspond to the plurality of first regions 30 having different lengths.

Accordingly, the plurality of flexible joints 40 are formed to have different lengths for each region on the substrate 10. Since each flexible joint is formed to correspond to one of the first regions formed with different lengths for each region, the length of each flexible joint may be different for each region. The lengths of the plurality of flexible joints become longer from the edge toward the central portion.

Figure 12:
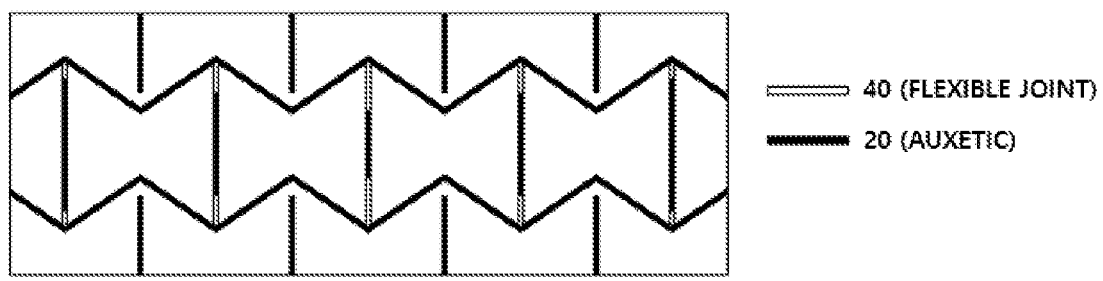
FIG. 12 is an exemplary diagram illustrating that flexible joints having different lengths are generated in regions according to one embodiment of the present invention.

More specifically, as shown in FIG. 12, a flexible joint having a relatively long length may be formed in the central portion of the substrate, and the length of the flexible joint may become short toward the edge. In other words, the length of the flexible joint may be shortened from the central portion to the edge of the substrate, and conversely, the length of the auxetic may be increased.

For example, as the length of the flexible joint is increased based on a specific axis, the length of the auxetic is decreased. Thus, stretching may be performed more easily in a portion of the corresponding axis. In other words, as the length of the flexible joint with a relatively small elastic modulus is increased, stretching may become easy.

That is, the flexible joint placed in the central portion of the auxetic stretchable substrate 100 of the present invention may be formed to have a length that is greater than the length of the flexible joint placed at the edge. This facilitates stretching in the central portion, in which a tensile force is relatively poorly transmitted compared to the edge region during stretching, thereby uniformizing a stress induced into the entirety of the substrate.

As described above, according to the present invention, the plurality of flexible joints may be formed to have different lengths for each region of the substrate. In a detailed example, in the auxetic stretchable substrate 100 of the present invention, the auxetic corresponding to the central portion may be connected through the flexible joint having the longest length, and the auxetic may be connected through each flexible joint with a length which becomes shorter toward the edge. According to the present invention, by forming the flexible joints having different lengths for each position of the substrate, when stretched, the substrate may generally have a uniform induced stress so that the Poisson's ratio is uniformly controlled.

Figure 13:
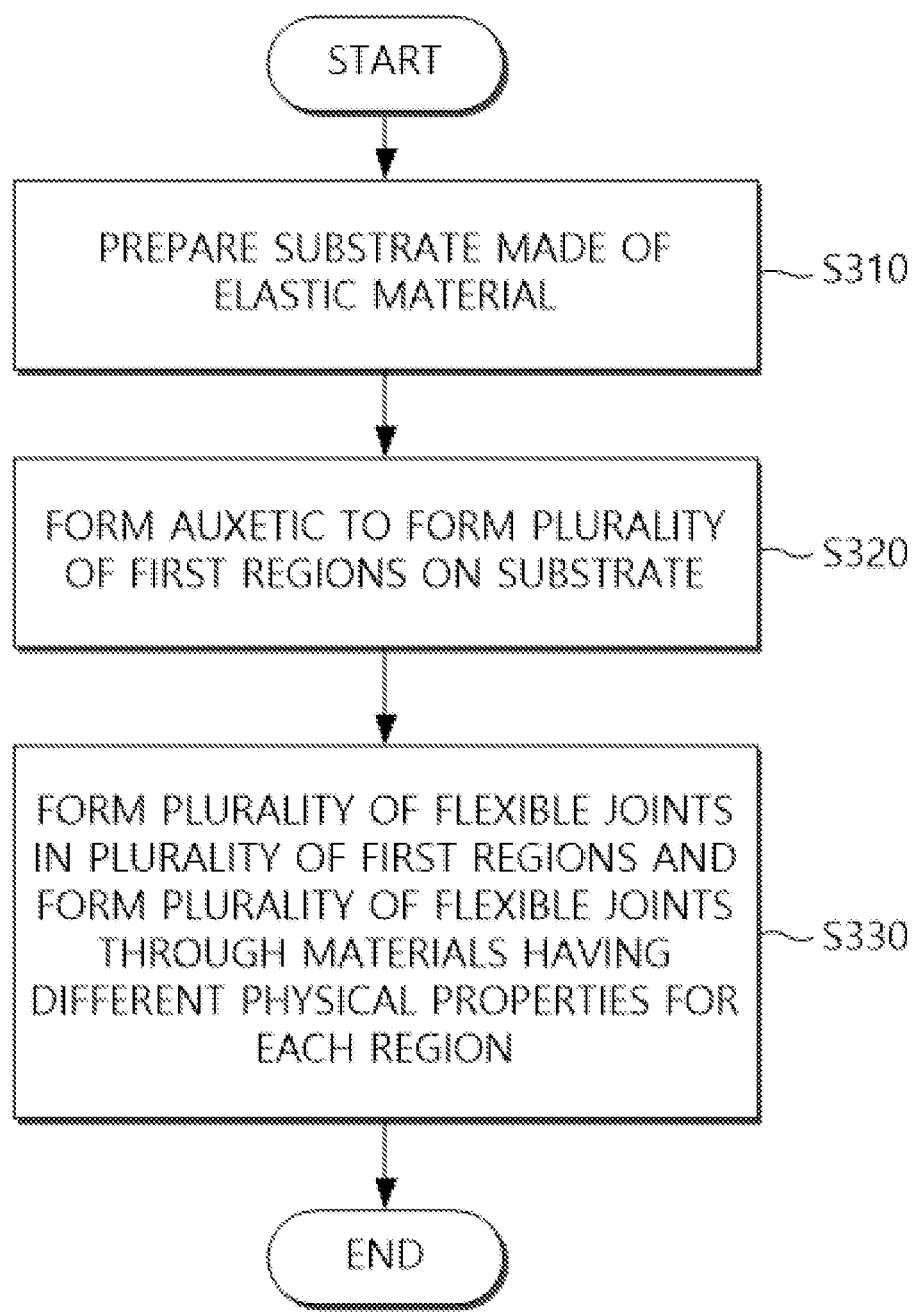
FIG. 13 is an exemplary flowchart illustrating a method of manufacturing an auxetic stretchable substrate with a flexible joint structure according to still another embodiment of the present invention.

FIG. 13 is an exemplary flowchart illustrating a method of manufacturing an auxetic stretchable substrate with a flexible joint structure according to still another embodiment of the present invention. The order of operations shown in FIG. 13 may be changed as necessary, and one or more operations may be omitted or added. Among features of the content shown in FIG. 13, for features identical to those described above in relation to FIGS. 6 to 12, the content described in FIGS. 6 to 12 can be referred to, and description thereof will be omitted herein.

According to still another embodiment of the present invention, a method of manufacturing an auxetic stretchable substrate with a flexible joint structure may include preparing a substrate 10 made of an elastic material (S310).

According to still another embodiment of the present invention, the method of manufacturing an auxetic stretchable substrate with a flexible joint structure may include forming an auxetic to form a plurality of first regions 30 on the substrate 10 (S320).

According to still another embodiment of the present invention, the method of manufacturing an auxetic stretchable substrate with a flexible joint structure may include forming a plurality of flexible joints in the plurality of first regions 30 and forming the plurality of flexible joints through materials having different physical properties for each region (S330). That is, at least some of flexible joints formed in the plurality of first regions 30 may have different Young's moduli.

In the embodiment, as in the description with reference to FIG. 10, providing the flexible joints formed of materials having different physical properties for each region of the substrate is for the purpose of uniformizing a stress which is applied to each unit structure body for each region of the substrate.

According to the embodiment, the flexible joint may be formed to have a Young's modulus ranging from 1 kPa to 10 Mpa. In a detailed example, the material forming the flexible joint should satisfy a Young's modulus condition of 60% or less compared to the material forming the auxetic. That is, the Young's modulus of the flexible joint should be a Young's modulus of 60 or less compared to the Young's modulus of 100 of the auxetic. For example, when the Young's modulus of the flexible joint exceeds 60 compared to the Young's modulus of 100 of the auxetic, even when the flexible joint is provided in a specific region, a stress concentration is induced in the corresponding region during stretching and thus there is a concern that shearing and delamination phenomena may occur.

In various examples, the plurality of flexible joints 40 are formed to have a relatively lower Young's modulus from the edge toward the central portion. For example, as the Young's modulus increases, the material may become hard. That is, the flexible joint placed at the edge of the auxetic stretchable substrate 100 of the present invention may be formed to have stiffness that is greater than stiffness of the flexible joint placed in the central portion. This facilitates stretching in the central portion, in which a tensile force is relatively poorly transmitted compared to the edge region when stretched, thereby making a stress induced in the entirety of the substrate uniform.

In one embodiment, the plurality of flexible joints 40 may be formed of materials having different physical properties for each position. In a detailed example, a flexible joint may be formed of a material having a physical property relating to relatively small mechanical strength (i.e., modulus) in the central portion of the auxetic stretchable substrate 100, and a flexible joint may be formed of a material having a physical property relating to relatively large mechanical strength in an edge region of the auxetic stretchable substrate 100. For example, a flexible joint may be formed of neoprene having relatively low mechanical strength, when compared to the edge region, in the central portion, and a flexible joint may be formed of isoprene having a relatively high mechanical strength, when compared to the central portion, in the edge region. The detailed descriptions of the above-described materials provided in relation to the regions are merely examples, and the present invention is not limited thereto.

Figure 14:
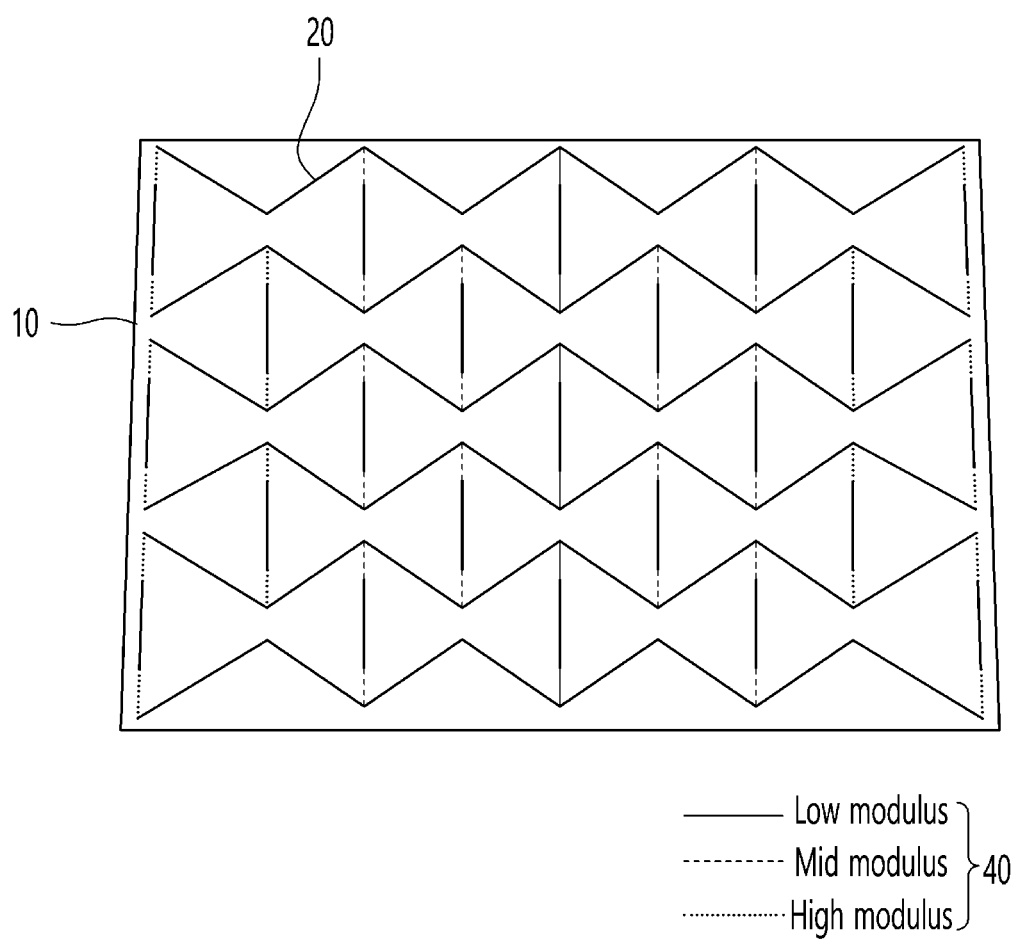
FIG. 14 is an exemplary diagram illustrating that flexible joints having different Young's moduli are generated in regions according to one embodiment of the present invention.

As a more detailed example, as shown in FIG. 14, the flexible joints corresponding to the central portion may each be formed using a material having mechanical strength at a low level, the flexible joints corresponding to regions between the central portion and the edge may each be formed using a material having mechanical strength at a middle level, and the flexible joints corresponding to the edge may each be formed using a material having mechanical strength at a high level. That is, in order to facilitate stretching toward the central portion, the flexible joints may each be formed using a material with relatively small mechanical strength.

Figure 15:
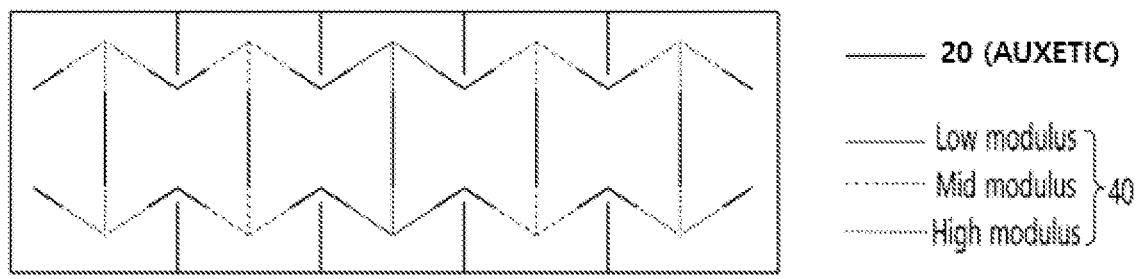
FIG. 15 is an exemplary diagram illustrating that flexible joints having different Young's moduli are generated in regions according to another embodiment of the present invention.

In various examples, the plurality of flexible joints 40 may be formed based on three sides of the first region. Specifically, instead of forming the flexible joint 40 based on one side of the first region in relation to an intersection region where the three sides meet as shown in FIG. 14, the plurality of flexible joints 40 may be formed based on three sides of the intersection region (i.e., the first region) as shown in FIG. 15. That is, as shown in FIG. 15, the plurality of flexible joints 40 may be provided to correspond to each first region in three directions. In addition, each flexible joint may be provided to have different mechanical strength for each region. As shown in FIG. 15, the flexible joints corresponding to the central portion of the substrate may each be formed using a material having mechanical strength at a low level, the flexible joints corresponding to regions between the central portion and the edge may each be formed using a material having mechanical strength at a middle level, and the flexible joints corresponding to the edge may each be formed using a material having mechanical strength at a high level. That is, in order to facilitate stretching toward the central portion, the flexible joints may each be formed using a material with relatively small mechanical strength. In the embodiment, when the flexible joints are provided to correspond to the three sides of the first region, there is an effect that an induced stress applied to each region during stretching can be more precisely controlled.

In an additional example, when the plurality of flexible joints 40 are formed based on the three sides of the first region, lengths corresponding to the three sides may be different. For example, the flexible joint may be formed to have a relatively long length corresponding to a first side in the longitudinal direction (e.g., a height direction of FIG. 15), and the flexible joints may be formed to have a relatively short length corresponding to the remaining sides (e.g., second and third sides). For example, the sum of the lengths of the flexible joints provided to correspond to the remaining two sides may be equal to the length of the flexible joint corresponding to the first side. The detailed description of the above-described length of the flexible joint corresponding to each side is merely an example, and the present invention is not limited thereto.

In various examples, curing is performed on a plurality of flexible joints so that the plurality of flexible joints may be formed. Specifically, the plurality of flexible joints 40 are printed on the plurality of first regions 30, formed in contact with the auxetic 20, and coupled to the auxetic 20 through curing. Here, the curing may be curing for coupling between each flexible joint 40 and the auxetic 20.

In various examples, the plurality of flexible joints are formed of the same material, and each flexible joint is cured for a different curing time at a different curing agent ratio and a different curing temperature for each region.

Specifically, in order to induce a uniform stress in the entirety of the substrate when stretched, the flexible joints should have different Young's moduli for each region. For example, as described above, the Young's modulus of the flexible joint should be increased toward the edge region from the central portion.

However, to this end, when the flexible joints are formed by utilizing materials having different mechanical strengths for each area, it may be difficult to secure transparency because a difference in refractive index is maximized due to a difference in mechanical strength between the materials. For example, when various materials are included, since a difference in refractive index between the materials occurs, there is a concern that resolution of a displayed screen may be degraded. That is, in order to improve visibility or transparency, it is advantageous to minimize the types of materials.

Accordingly, the present invention may be characterized in that all the flexible joints are formed of the same material regardless of the regions of the substrate. In this case, the flexible joints may have different mechanical strengths by differentiating curing conditions.

Figure 16:
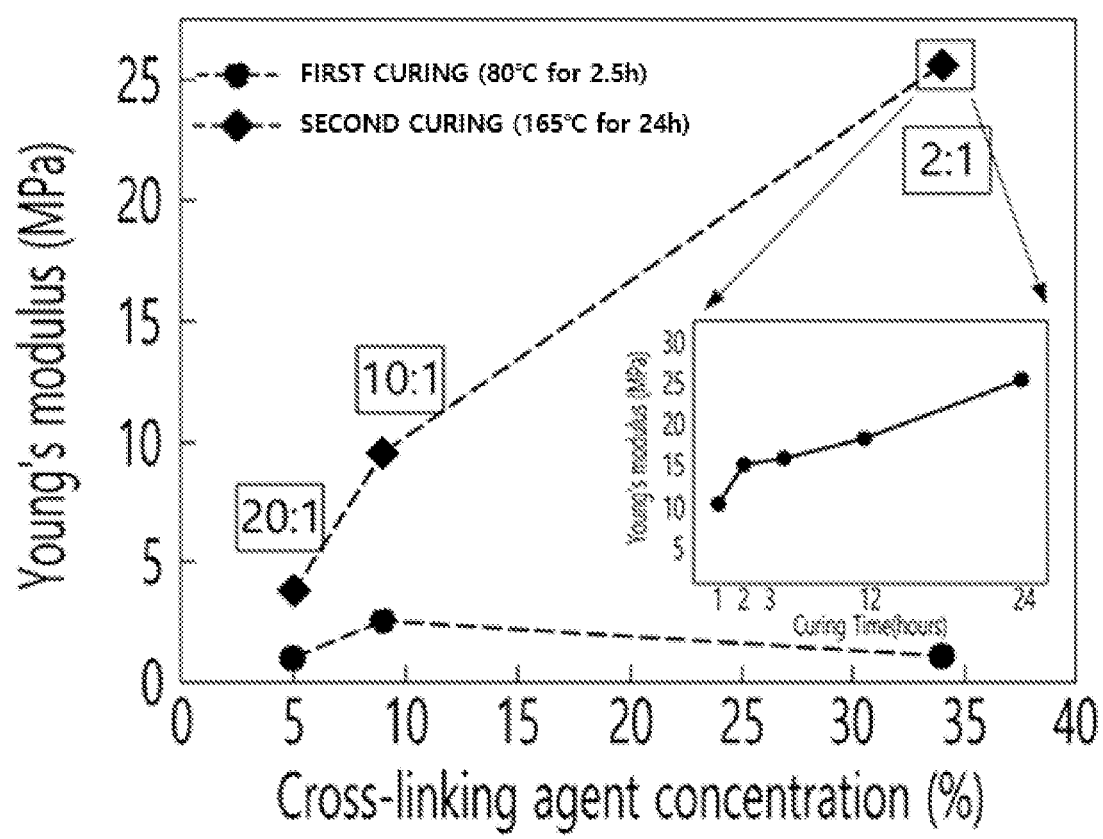
FIG. 16 is an exemplary graph showing a mechanical strength change according to curing conditions according to one embodiment of the present invention.

According to the embodiment, the mechanical strength of the flexible joint may vary according to a change in curing time and curing temperature. More specifically, referring to FIG. 16, in first curing performed at a relatively low temperature for a short period of time (e.g., low temperature curing performed at a temperature of 80 degrees for 2.5 hours), it can be confirmed that a change (or difference) in modulus (i.e., mechanical strength) is not large in response to each curing ratio. Conversely, in second curing performed at a relatively high temperature for a long period of time (e.g., high temperature curing performed at a temperature of 165 degrees for 24 hours), it can be confirmed that the change (or difference) in modulus is large in response to each curing ratio. In particular, as shown in FIG. 16, the second curing exhibited a meaningful change in mechanical strength in response to a first ratio (i.e., a ratio of an elastic material to the curing agent of 20:1) and a second ratio (i.e., a ratio of the elastic material to the curing agent of 2:1). In other words, the second curing performed at a high temperature for a long period of time may not meaningfully change the mechanical strength of the flexible joint composed of the first ratio and may cause a meaningful change in the mechanical strength of the flexible joint composed of the second ratio. That is, in the present invention, the flexible joints included in the auxetic stretchable substrate 100 may be provided to have different mechanical strengths according to the above-described curing conditions.

In a detailed embodiment, in the case of the flexible joint in the edge region, the mechanical strength may be increased by increasing a ratio of the curing agent to the elastic material and performing curing at a high temperature for a long period of time, and in the case of the flexible joint in the central portion, the mechanical strength may be reduced by decreasing the ratio of the curing agent to the elastic material and performing curing at a low temperature for a short period of time.

That is, according to the present invention, the flexible joints may be formed of the same material regardless of the regions of the substrate and may have different mechanical strengths for each region by differentiating the curing conditions. In other words, uniform Poisson's ratio control may be achieved in terms of the entirety of the substrate.

In accordance with the present invention, a stretchable substrate has a negative Poisson's ratio, and a strain in a vertical direction of an in-plane relative to a stretching direction can be controlled while a stress distribution induced in a substrate is simultaneously uniformized to uniformly control the Poisson's ratio.

In addition, in accordance with the present invention, the stretchable substrate can be freely used by being deformed in multi-dimensional axial directions in various conditions. Additionally, during stretching based on one axis, strain generated in a direction perpendicular to a stretching direction can be controlled to reduce screen distortion.

It should be noted that effects of the present invention are not limited to the above described effect, and other effects of the present invention that are not mentioned above can be clearly understood by those skilled in the art from the above detailed description.

While embodiments of the present invention have been described with reference to the accompanying drawings, those skilled in the art can understand that the present invention can be implemented in other specific forms without departing from the technical spirit or the necessary features of the present invention. Therefore, it should be understood that the above-described embodiments are not restrictive but illustrative in all aspects.

Specific operations described in the present invention are examples and do not limit the scope of the present invention in any method. For simplicity of a description, the description of conventional electronic configurations, control systems, software, and other functional aspects of such systems may be omitted. Also, the connection of lines between the components shown in the drawings, or connecting members illustratively show functional connections and/or physical or circuit connections, and, in an actual device, they may be represented as alternative or additional various functional connections, physical connections, or circuit connections. Also, unless stated otherwise, such as "essential," "important," and the like, it may not be a necessary component for the application of the present invention.

It should be understood that the specific order or hierarchical structure of operations in the proposed processes is an example of exemplary approaches. On the basis of design priorities, it should be understood that the specific order or hierarchical structure of operations in the processes can be rearranged without departing from the scope of the present invention. The appended method claims present elements of the various operation in a sample order, but do not mean to be limited to the proposed specific order or hierarchical structure.

The descriptions of the above embodiments are provided to allow those skilled in the art to use or practice the present invention. Various modifications of these embodiments will be apparent to those skilled in the art, and the general principles defined herein can be applied to other embodiments without departing from the scope of the present invention. Thus, the present invention is not to be limited to the embodiments disclosed herein but is to be construed in the widest scope consistent with the principles and novel features disclosed herein.

What is claimed is:

1. A method of manufacturing an auxetic stretchable substrate with a flexible joint structure, the method comprising:
   preparing a substrate made of an elastic material; and
   forming an auxetic to form a plurality of first regions on the substrate,
   wherein each of the plurality of first regions is a region in which a material constituting the auxetic is not printed, and at least some of the plurality of first regions have different lengths.

2. The method of claim 1, wherein:
   the auxetic includes a plurality of unit structure bodies, each having a re-entrant shape; and
   the first region is formed in an intersection region where a plurality of sides forming each unit structure body intersect.

3. The method of claim 1, further comprising forming a plurality of flexible joints in each of the plurality of first regions,
   wherein the plurality of flexible joints are formed to be coupled to the auxetic through a printing process.

4. The method of claim 3, wherein the plurality of flexible joints are each formed of a material having an elastic modulus that is relatively lower than that of the auxetic.

5. The method of claim 3, wherein the forming of the auxetic includes forming the auxetic through differential patterning for differentiating sizes of the first regions for each region.

6. The method of claim 5, wherein lengths of the plurality of flexible joints become longer from an edge toward a central portion of the substrate.

7. The method of claim 3, wherein lengths of the plurality of flexible joints become shorter as a deviation in Young's modulus between the flexible joint and the auxetic increases.

8. An auxetic stretchable substrate with a flexible joint structure, comprising:
   a substrate made of an elastic material; and
   an auxetic formed on the substrate and including a plurality of first regions,
   wherein each of the plurality of first regions is a region in which a material constituting the auxetic is not printed, and at least some of the plurality of first regions have different lengths.

9. The auxetic stretchable substrate of claim 8, wherein:
   the auxetic includes a plurality of unit structure bodies, each having a re-entrant shape; and
   the first region is formed in an intersection region where a plurality of sides forming each unit structure body intersect.

10. The auxetic stretchable substrate of claim 8, wherein:
    the auxetic stretchable substrate further includes a plurality of flexible joints provided in the plurality of first regions; and
    the plurality of flexible joints are formed to be coupled to the auxetic through a printing process.

11. The auxetic stretchable substrate of claim 10, wherein the plurality of flexible joints are each formed of a material having an elastic modulus that is relatively lower than that of the auxetic.

12. The auxetic stretchable substrate of claim 10, wherein the auxetic is formed through differential patterning for differentiating sizes of the first regions for each region.

13. The auxetic stretchable substrate of claim 10, wherein lengths of the plurality of flexible joints become longer from an edge toward a central portion of the substrate.

14. The auxetic stretchable substrate of claim 10, wherein lengths of the plurality of flexible joints become shorter as a deviation in Young's modulus between the flexible joint and the auxetic increases.

15. A flexible electronic device comprising:
    a stretchable substrate; and
    a flexible electrode formed on the stretchable substrate,
    wherein the stretchable substrate includes:
    a substrate made of an elastic material; and
    an auxetic formed on the substrate and including a plurality of first regions, and
    each of the plurality of first regions is a region in which a material constituting the auxetic is not printed, and at least some of the plurality of first regions have different lengths.

* * * * *